(12) United States Patent
Kim et al.

(10) Patent No.: US 9,876,064 B2
(45) Date of Patent: Jan. 23, 2018

(54) FLEXIBLE ORGANIC ELECTROLUMINESCENT DEVICE AND METHOD FOR FABRICATING THE SAME

(71) Applicant: LG DISPLAY CO., LTD., Seoul (KR)

(72) Inventors: Su Ho Kim, Gumi-si (KR); Sang Bae Kim, Daegu (KR); Jun Tae Jeon, Gumi-si (KR); Yong Sam Lee, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 70 days.

(21) Appl. No.: 14/136,014

(22) Filed: Dec. 20, 2013

(65) Prior Publication Data

US 2015/0060778 A1    Mar. 5, 2015

(30) Foreign Application Priority Data

Aug. 30, 2013  (KR) .................. 10-2013-0104342
Dec. 3, 2013   (KR) .................. 10-2013-0149446

(51) Int. Cl.
| | | |
|---|---|---|
| H01L 29/08 | (2006.01) | |
| H01L 27/32 | (2006.01) | |
| H01L 51/00 | (2006.01) | |
| H01L 51/52 | (2006.01) | |

(52) U.S. Cl.
CPC ...... H01L 27/3258 (2013.01); H01L 51/0097 (2013.01); H01L 51/5253 (2013.01); H01L 51/5293 (2013.01); *Y02E 10/549* (2013.01)

(58) Field of Classification Search
CPC ............ H01L 51/5228; H01L 51/5234; H01L 51/5293; H01L 51/5253; H01L 51/0097; H01L 27/3258; Y02E 10/549

USPC .............................................. 257/40; 438/23
See application file for complete search history.

(56) References Cited

U.S. PATENT DOCUMENTS

| | | | | |
|---|---|---|---|---|
| 2002/0047977 A1* | 4/2002 | Lee | .................. | G02F 1/136259 349/141 |
| 2004/0232418 A1* | 11/2004 | Koyama | ............. | H01L 27/3244 257/59 |
| 2005/0110023 A1* | 5/2005 | Lee | ..................... | H01L 27/3276 257/72 |
| 2005/0197031 A1* | 9/2005 | Yamazaki | ........... | H01L 27/3211 445/24 |
| 2008/0017855 A1* | 1/2008 | Kim | ..................... | G02F 1/1309 257/48 |
| 2008/0224599 A1* | 9/2008 | Kim | ..................... | H01L 27/3258 313/504 |
| 2010/0127615 A1* | 5/2010 | Kim | ..................... | H01L 27/3251 313/504 |

(Continued)

FOREIGN PATENT DOCUMENTS

| | | |
|---|---|---|
| CN | 102569347 A | 7/2012 |
| JP | 2001-237065 A | 8/2001 |

(Continued)

*Primary Examiner* — Vongsavanh Sengdara
(74) *Attorney, Agent, or Firm* — Dentons US LLP

(57) ABSTRACT

Provided is a flexible organic electroluminescent device and a method for fabricating the same. In the flexible electroluminescent device, line hole patterns are formed on surfaces of a plurality of inorganic layers positioned in a pad region in which a flexible printed circuit board is connected to prevent a path of cracks caused by repeated bending and spreading of the organic electroluminescent device from spreading to the interior of the device.

12 Claims, 14 Drawing Sheets

(56) References Cited

U.S. PATENT DOCUMENTS

2011/0204369 A1\* 8/2011 Ha .................... H01L 51/5228
 257/59
2012/0092599 A1\* 4/2012 Lee .................. G02F 1/133784
 349/106

FOREIGN PATENT DOCUMENTS

| JP | 2007-179813 A | 7/2007 |
| JP | 2011171278 A | 9/2011 |
| JP | 2013-68951 A | 4/2013 |
| JP | 2013-73001 A | 4/2013 |

\* cited by examiner

FLEXIBLE ORGANIC ELECTROLUMINESCENT DEVICE AND METHOD FOR FABRICATING THE SAME

CROSS-REFERENCE TO RELATED APPLICATIONS

This application claims the benefit of the Korean Patent Application No. 10-2013-0104342 filed on Aug. 30, 2013, and Korean Patent Application No. 10-2013-0149446, filed on Dec. 3, 2013, which are hereby incorporated by reference for all purposes as if fully set forth herein.

BACKGROUND OF THE INVENTION

Field of the Invention

The present invention relates to an organic electroluminescent device (or an organic light emitting display device. More particularly, the present invention relates to a flexible organic electroluminescent device capable of minimizing the generation of cracks by a step portion with a line hole formed in a pad region in which cracks are readily generated, or a non-display region including the pad region, and a method for fabricating the same.

Discussion of the Related Art

An organic electroluminescent device, one of flat panel displays (FPDs), has a high degree of luminance and low operational voltage characteristics. Also, because the organic electroluminescent device is a self-luminous device, it has a large contrast ratio, is able to be used as an ultra-thin display, has a response time as fast as a few microseconds (μs) to facilitate implementation of a video, has no limitation in a viewing angle, is stable at low temperatures, and is driven at a low voltage ranging from 5V to 15V of direct current.

Also, the fabrication process of the organic electroluminescent device requires only deposition and encapsulation equipment, which is thus very simple.

The organic electroluminescent device having the foregoing characteristics is divided into a passive matrix type organic electroluminescent device and an active matrix type organic electroluminescent device. In the passive matrix type organic electroluminescent device, scan lines and signal lines cross in a matrix form, and in order to drive each pixel, the scan lines are sequentially driven over time. Thus, in order to obtain the required average luminance, instantaneous luminance corresponding to a value obtained by multiplying the number of lines to average luminance (i.e., instantaneous luminance as high as the product of average luminance and the amount of lines) is required to be obtained.

However, in the active matrix type organic electroluminescent device, a thin film transistor (TFTs) is used as a switching element for turning on or off a pixel region and positioned in each pixel region. The TFT is connected to a power line and an organic light emitting diode (OLED) in each pixel region.

In this case, a first electrode connected to the driving TFT is turned on and off by pixel region, and a second electrode facing the first electrode may serve as a common electrode. The first electrode and the second electrode form the OLED together with an organic light emitting layer interposed therebetween.

In the active matrix type organic electroluminescent device having the foregoing characteristics, a voltage applied to the pixel region is charged in a storage capacitor Cst to supply power until when a next frame signal is applied, whereby the device is continuously driven during a single screen regardless of an amount of scan lines.

Thus, although a low current is applied, the same luminance can be obtained, having advantages in that less power is consumed, a fine pitch can be obtained, and a display size can be increased. These features have led to an increase in active matrix type organic electroluminescent devices being commonly used.

The related art organic electroluminescent device will be described with reference to FIGS. 1 and 2.

FIG. 1 is a plan view illustrating the related art organic electroluminescent display device.

FIG. 2 is a cross-sectional view of the related art organic electroluminescent device taken along line II-Ii in FIG. 1.

In FIG. 1, the related art organic electroluminescent device 10, a display region AA is defined in a substrate (not shown), a non-display region (not shown) having a pad region PD is defined in an outer side of the display region AA, a plurality of pixel regions (not shown) defined as regions captured by the gate lines (not shown) and data lines (not shown) are provided in the display region AA, and power lines (not shown) are provided in parallel to the data lines (not shown).

A TFT is formed in each pixel region (not shown).

In the related art organic electroluminescent device 10, a substrate (11 in FIG. 2) in which the TFT and an organic electroluminescent element (or an OLED) E are formed is encapsulated with a protective film (47 in FIG. 2).

In detail, as illustrated in FIG. 2, the display region AA is defined in the substrate 11, and a non-display region including a pad region PD is defined in an outer side of the display region AA. A plurality of pixel regions (not shown) defined by regions formed by the gate lines (not shown) and the data lines (not shown) are provided in the display region AA, and power lines (not shown) are provided in parallel to the data lines (not shown).

Here, a polyimide layer 15 is formed on the substrate 11 made of a glass material, and a sacrificial layer 13 is formed between the polyimide layer 15 and the substrate 11.

A buffer layer 17 made of an insulating material, e.g., silicon oxide ($SiO_2$) or silicon nitride ($SiNx$) as an inorganic insulating material, is formed on the polyimide layer 15.

Also, an active layer 19 is formed in each pixel region of the display region AA above the buffer layer (not shown). The active layer 19 includes a channel region 19a made of pure polysilicon and having a central portion forming a channel, and a source region 19b and a drain region 19c formed on both sides of the channel region 19a and having impurities doped with high concentration.

A gate insulating layer 21 is formed on the buffer layer (not shown) including the active layer 19, and a gate electrode 23 is formed to correspond to the channel region 19a of each active layer 19 above the gate insulating layer 21.

Also, a gate line (not shown) is formed to extend from the gate electrode 23 in one direction above the gate insulating layer 21.

An interlayer insulating layer 25 is formed on the entire surface of the display region above the gate electrode 23 and the gate line (not shown). In this case, the interlayer insulating layer 25 and the underlying gate insulating layer 21 include contact holes (not shown) exposing the source region 19a and the drain region 19c positioned on both sides of the channel region 19a of each active layer, respectively.

Also, a data line (not shown) is formed above the interlayer insulating layer 25 including the contact holes (not shown). The data line crosses a gate line (not shown) to define a pixel region, and is made of a metal. A power line (not shown) is formed to be spaced apart from the data line. Here, the power line (not shown) may also be formed to be spaced apart from the gate line and parallel to the gate line (not shown) on the layer in which the gate line (not shown) is formed, namely, on the gate insulating layer.

A source electrode 27a and a drain electrode 27b are formed on the interlayer insulating layer 25. The source electrode 27a and the drain electrode 27b are spaced apart from each other, are in contact with the source region 19b and the drain region 19c, respectively, exposed through the contact holes (not shown), and are made of the same metal as that of the data line (not shown). In this case, the active layer 19, the gate insulating layer 21, the gate electrode 23, and the interlayer insulating layer 25, which are sequentially stacked, and the source electrode 27a and the drain electrode 27b formed to be spaced apart from each other all form a TFT (T).

A first passivation layer 31 having a drain contact hole exposing the drain electrode 27b of the TFT (T) and a planarization layer 33 is formed on the TFT.

Also, a first electrode 35 is formed on the planarization layer 33. The first electrode 35 is in contact with the drain electrode 27b of the TFT (T) through the drain contact hole and is separated by pixel region.

A pixel defining layer 37 is formed on the first electrode 35 to separately form each pixel region. In this case, the pixel defining layer 37 is disposed between adjacent pixel regions.

An organic light emitting layer 39 is formed on the first electrode within each pixel region surrounded by the pixel defining layer 37 and includes light emitting layers (not shown) emitting red, green, and blue light.

Also, a second electrode 41 is formed on substantially the entire surface of the display region AA including on the organic light emitting layer 39 and the pixel defining layer 37. In this case, the first electrode 35, the second electrode 41, and the organic light emitting layer 39 interposed between the two electrodes 35 and 41 form an organic electroluminescent element E.

An organic layer 43 is formed on the entire surface of the substrate including the second electrode 41, and a second passivation layer 45 is formed on the organic layer 43.

A barrier film 47 is positioned on the second passivation layer 45 in order to encapsulate the organic electroluminescent element E and prevent moisture transmission. A press sensitive adhesive (PSA) (not shown) is interposed to be completely and tightly attached to the substrate 11 and the barrier film 47 without an air layer. A polarization plate 53 is disposed on the barrier film 47. In this case, the second passivation layer 45, the PSA, and the barrier film 47 form a face seal structure.

In this manner, the substrate 11 and the barrier film 47 are fixed by the PSA to form a panel state, constructing the related art organic electroluminescent device.

In order to make the organic electroluminescent device 10 configured as described above into a flexible organic electroluminescent device, first, a rear surface of the substrate 11 of the organic electroluminescent device 10 is cleaned, and laser is irradiated to separate the sacrificial layer 13 interposed between the substrate 11 and the polyimide layer 15, thus delaminating the substrate 11 from the organic electroluminescent device 10.

Thereafter, a back plate is laminated on a surface of the polyimide layer 15 of the separated organic electroluminescent device to form a flexible organic electroluminescent device.

However, when the substrate 11 is separated from the organic electroluminescent device to fabricate the flexible organic electroluminescent device, the organic electroluminescent device 10 is bent due to self-stress of the barrier film 47, the polarization plate 53, and the TFT (T) constituting the organic electroluminescent device.

FIG. 3 is a schematic perspective view of the related art organic electroluminescent device illustrating a scenario in which cracks are spread from the pad region of the organic electroluminescent device to cause a curling phenomenon in the organic electroluminescent device.

As illustrated in FIG. 3, during the process of laminating a back plate (not shown) on the surface of the polyimide layer 15 without the substrate 11, bending and spreading are repeated to generate cracks C in a vulnerable region, e.g., the pad region PD to which a flexible printed circuit board (FPCB) is connected, and the cracks C spread even to the TFT part to result in a defective organic electroluminescent device. In particular, after the substrate 11 is removed, the layers constituting the pad region PD are mostly inorganic layers, and the polyimide layer 15 is so brittle as to be vulnerable to a generation of cracks. Thus, in fabricating the related art flexible organic electroluminescent device, because cracks C are generated in the pad region PD to which the FPCB is connected, i.e., a weak region, due to the repetition of bending and spreading to the TFT within the device, to produce a defective organic electroluminescent device.

Also, the cracks increase during a follow-up process to interfere with a signal line of a panel, which leads to defective driving and a defective screen.

SUMMARY OF THE INVENTION

Accordingly, the present invention is directed to a flexible organic electroluminescent device and method for fabricating the same that substantially obviate one or more problems due to limitations and disadvantages of the related art.

An advantage of invention is to provide a flexible organic electroluminescent device in which line hole patterns are formed on surfaces of a plurality of inorganic layers positioned in a pad region to which a FPCB is connected, that is weak due to repeated bending and spreading when the organic electroluminescent device is fabricated, in order to redirect a path of cracks so that the cracks do not spread to the interior of the device. Thus, damage to the flexible organic electroluminescent device is minimized.

To achieve these and other advantages and in accordance with the purpose of this specification, as embodied and broadly described herein, a flexible organic electroluminescent device includes: a substrate having a display region including a plurality of pixel regions and a non-display region including a pad region outside the display region; a plurality of thin film transistors (TFTs) formed in the respective pixel regions on the substrate; an interlayer insulating layer and a passivation layer formed in the display region including the TFTs and the non-display region in the pad region of the non-display region; at least one line hole pattern formed in at least one of the interlayer insulating layer and the passivation layer located at the non-display region; a first electrode formed in each pixel region on the planarization layer and connected to a drain electrode of each TFT; a pixel defining layer formed around each pixel region of the substrate including the first electrode and the non-display region; an organic light emitting layer formed separately in each pixel region on the first electrode; and a second electrode formed on the entire surface of the display region above the organic light emitting layer.

To achieve these and other advantages and in accordance with the purpose of this specification, as embodied and broadly described herein, a method for fabricating a flexible organic electroluminescent device, includes: providing a substrate in which a display region including a plurality of pixel regions and a non-display region including a pad region outside the display region are defined; forming a plurality of thin film transistors (TFTs) in the respective pixel regions on the substrate; forming an interlayer insulating layer and a passivation layer on the entire surface of the substrate including the TFTs; forming at least one line hole pattern in at least one of the interlayer insulating layer and the passivation layer located at the non-display region; forming a planarization layer on the passivation layer; forming a first electrode connected to a drain electrode of each TFT in each pixel region on the planarization layer; forming a pixel defining layer around each pixel region of the substrate including the first electrode; forming an organic light emitting layer in each pixel region above the first electrode; and forming a second electrode on the entire surface of the display region including the organic light emitting layer.

According to the flexible organic electroluminescent device and the method for fabricating the same according to the present embodiments, line hole patterns are formed in surfaces of a plurality of inorganic layers, i.e., the gate insulating layer, the interlayer insulating layer, and the passivation layer, positioned in a weak region, i.e., a pad region to which an FPCB is connected, or a non-display region including the pad region due to repeated bending and in spreading when the organic electroluminescent device is fabricated. Thus, a path of cracks is redirected and prevented from spreading to the interior of the device, which minimizes damage to the flexible organic electroluminescent device.

In particular, because a plurality of line hole patterns are formed in a weak point that is adjacent to a scribe line to redirect a path of line damage and cracks in the weak point, panel line cracks, as a critical point, can be prevented.

Further, a trimming cutting is applied on trimming lines defined at edges of upper and lower of the pad region of a panel in fabricating of the flexible organic electroluminescent device because a curve hole pattern is formed at the upper and lower of the pad region to surround the trimming line of the pad region so that a path of cracks is redirected and prevented from spreading to the interior of the device; thereby minimizing damage to the flexible organic electroluminescent device.

Further, in a case that a trimming cutting is applied on trimming lines defined at edges of upper and lower of the non-display region located opposite to the pad region including the edges of the upper and lower of the pad region in fabricating of the flexible organic electroluminescent device, because a line hole pattern extended from the curve hole pattern is further formed at the non-display region including the pad region to be surround the trimming line and the display region, so that a path of cracks is redirected and prevented from spreading to the interior of the device; thereby minimizing damage to the flexible organic electroluminescent device.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE ILLUSTRATED EMBODIMENTS

Figure 1:
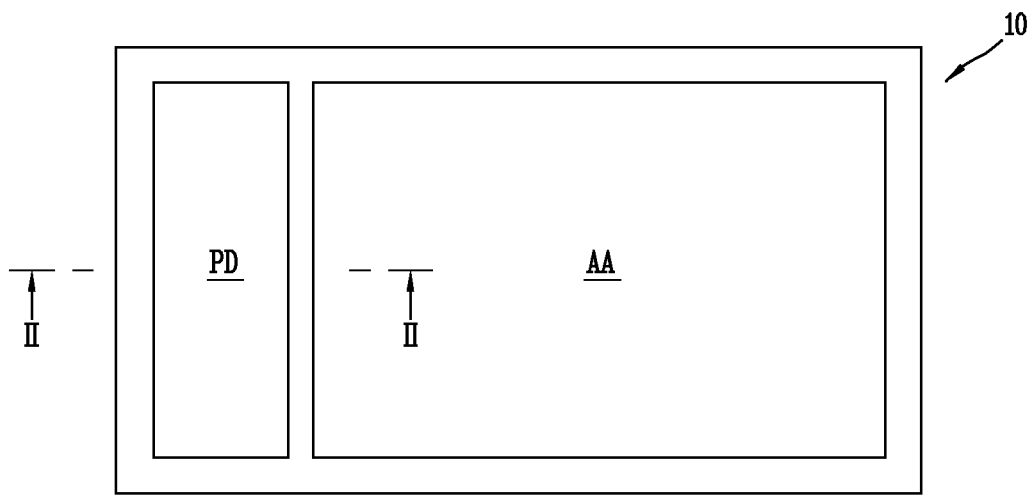
FIG. 1 is a plan view illustrating an organic electroluminescent device according to the related art.
Figure 2:
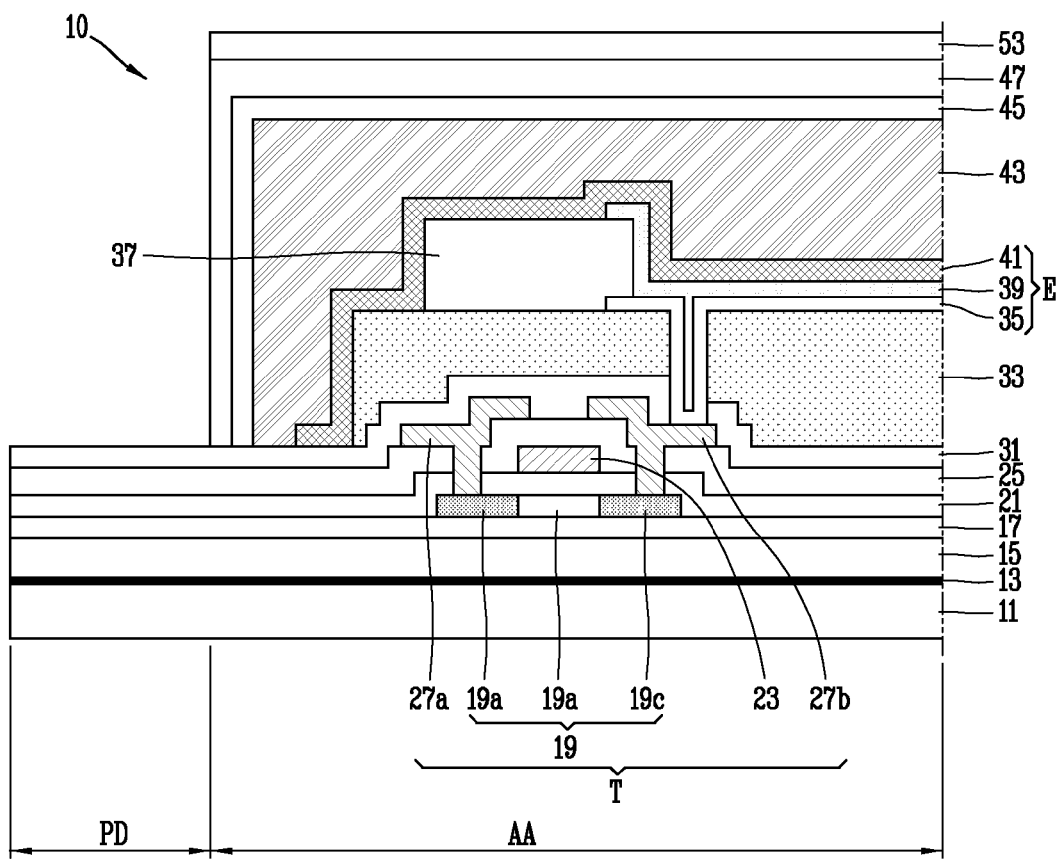
FIG. 2 is a cross-sectional view of the related art organic electroluminescent device, taken along line II-II in FIG. 1.
Figure 3:
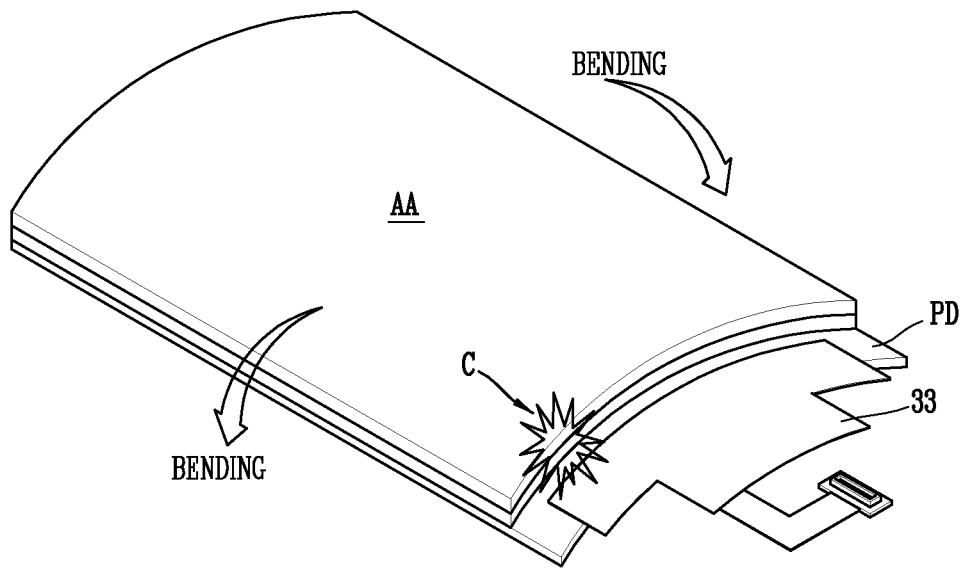
FIG. 3 is a schematic perspective view of the related art organic electroluminescent device, illustrating cracks are transmitted from a pad region of the organic electroluminescent device to cause curling of the organic electroluminescent device.

A flexible organic electroluminescent device according to embodiments of the present invention will be described in detail with reference to the accompanying drawings.

Hereinafter, embodiments will be described in detail with reference to the accompanying drawings such that they can be easily practiced by those skilled in the art to which the present invention pertains. In describing the present invention, if a detailed explanation for a related known function or construction is considered to unnecessarily divert the gist of the present invention, such explanation will be omitted but would be understood by those skilled in the art. Also, similar reference numerals are used for the similar parts throughout the specification.

The flexible organic electroluminescent device according to an embodiment of the present invention may be divided into a top emission type device and a bottom emission type device based upon a direction in which emitted light is transmitted. Hereinafter, the bottom emission type device will be described as an example.

The flexible organic electroluminescent device according to an embodiment of the present invention will be described in detail with reference to the accompanying drawings.

Figure 4:
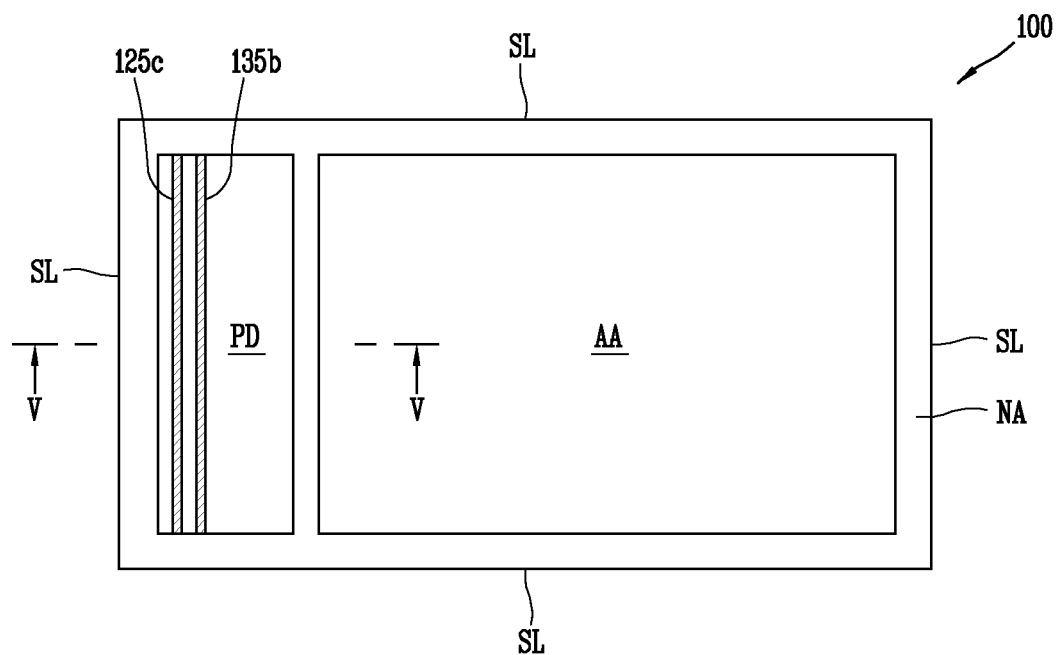
FIG. 4 is a plan view illustrating a flexible organic electroluminescent device according to an embodiment of the present invention.
Figure 5:
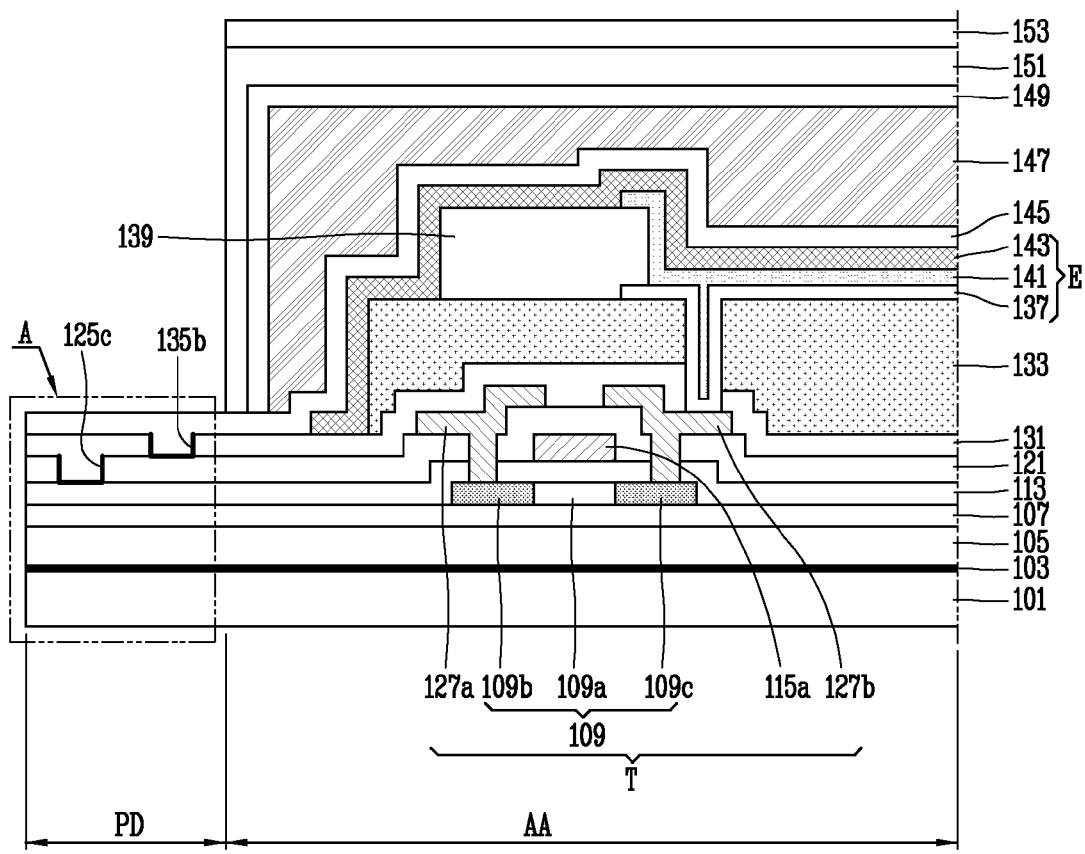
FIG. 5 is a schematic cross-sectional view of the flexible organic electroluminescent device according to an embodiment of the present invention, taken along line V-V in FIG. 4.

FIG. 4 is a plan view schematically illustrating the flexible organic electroluminescent device according to an embodiment of the present invention;

FIG. 5 is a cross-sectional view of the flexible organic electroluminescent device according to an embodiment of the present invention, taken along line V-V in FIG. 4.

Figure 6:
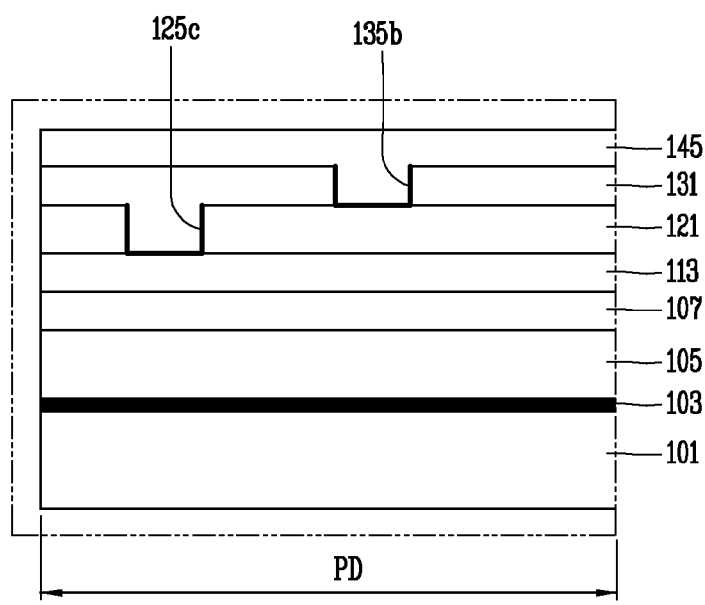
FIG. 6 is an enlarged cross-sectional view of a pad region of the flexible organic electroluminescent device according to an embodiment of the present invention.

FIG. 6 is an enlarged cross-sectional view of a pad region PD of the flexible organic electroluminescent device according to an embodiment of the present invention.

Here, a thin film transistor (T) assumes the same as a driving thin film transistor (T) as shown in FIG. 5. Further, the thin film transistor (T) can be used as a switching thin film transistor.

In the flexible organic electroluminescent device 100 according to an embodiment of the present invention, a substrate 101 in which a thin film transistor (TFT) (not shown) and an organic electroluminescent element E are formed is encapsulated by a barrier film 151.

In detail, referring to FIGS. 4 and 5, in the flexible organic electroluminescent device 100 according to an embodiment of the present invention, a display region AA is defined on a substrate 101 made of, for example, glass, a non-display region NA having a pad region PD is defined in an outer side of the display region AA, a plurality of pixel regions (not shown) defined as regions formed by crossings of the gate lines (not shown) and data lines (not shown) are provided in the display region AA, and power lines (not shown) are provided in parallel to the data lines (not shown).

Here, the substrate 101 made of, for example, glass is delaminated after fabrication of the organic electroluminescent device, and a flexible back plate (not shown) (161 in FIG. 7S) is laminated on the delaminated portion. The back plate 161 is formed of a flexible glass substrate or a flexible material, for example a polyimide film, having flexibility so that although the flexible organic electroluminescent device is bent (or warped) like paper, for example, the device may still perform as a display.

Also, a polyimide layer 105 is formed on the substrate 101, and a buffer layer 107 having, for example, a multilayer structure made of an inorganic insulating material, e.g., silicon oxide ($SiO_2$) or a silicon nitride (SiNx) is formed on the polyimide layer 105. In this embodiment, the reason for forming the buffer layer 107 below an active layer 109 formed in a follow-up process is to prevent degradation of the characteristics of the active layer 109 due to emission of alkali ions from the interior of the substrate 101 when the active layer 109 is crystallized.

A sacrificial layer 103 made of amorphous silicon or silicon nitride (SiNx) is formed between the substrate 101 and the polyimide layer 105. The sacrificial layer 103 serves to allow the substrate 101 to be easily delaminated and separated from the polyimide layer 105 through a laser irradiation process after fabrication of the organic electroluminescent device.

Also, the active layer 109 is formed in each pixel region of the display region AA above the buffer layer 107. The active layer 109 includes a channel region 109a made of pure polysilicon and having a central portion forming a channel, and a source region 109b and a drain region 109c formed in both sides of the channel region 109a and having impurities doped with high concentration.

A gate insulating layer 113 is formed on the buffer layer 107 including the active layer 109, and a gate electrode 115a is formed to correspond to the channel region 109a of each active layer 109 above the gate insulating layer 113. At least one line hole pattern 125c may be formed in a longer-side direction of the pad region PD, namely, opposing the display region AA in an interlayer insulating layer 121 positioned in the pad region PD.

Also, a gate line (not shown) is formed to extend from the gate electrode 115a in one direction above the gate insulating layer 113. The gate electrode 115a and the gate line (not shown) may be made of a first metal material, e.g., any one of aluminum (Al), an Al alloy (AlNd), copper (Cu), a Cu alloy, molybdenum (Mo), and molytitanium (MoTi) to have a unilayer structure, or may be formed of two or more first metal materials to have a dual-layer or a triple-layer structure. In the drawings, the gate electrode 115a and the gate line (not shown) are illustrated to have a unilayer structure.

An interlayer insulating layer 121 is formed on the entire surface of the display region of the substrate including the gate electrode 115a and the gate line (not shown). The interlayer insulating layer 121 is made of an insulating material, e.g., a silicon oxide ($SiO_2$) or a silicon nitride (SiNx) as an inorganic insulating material. In this case, the interlayer insulating layer 121 and the underlying gate insulating layer 113 include active layer contact holes (not shown) exposing the source region 109a and the drain region 109c positioned in both sides of the channel region 109a of the active layer 109, respectively.

Also, the interlayer insulating layer 121 positioned in the pad region PD has at least one first line hole pattern 125c formed therein. Here, the first line hole pattern 125c is formed in a longer-side direction of the pad region PD, namely, opposing the display region AA.

In addition, a data line (not shown) is formed above the interlayer insulating layer 121 including the active layer contact holes (not shown). The data line crosses a gate line (not shown) to define a pixel region (not shown). The data line may be made of a second metal material, e.g., any one or two or more of aluminum (Al), an Al alloy (AlNd), copper (Cu), a Cu alloy, molybdenum (Mo), molytitanium (MoTi), chromium (Cr), and titanium (Ti). A power line (not shown) is formed to be spaced apart from the data line. In this case, the power line (not shown) may also be formed on a layer in which the gate line is formed, namely, on the gate insulating layer 113 such that it is spaced apart from the gate line.

A source electrode 127a and a drain electrode 127b are formed on the interlayer insulating layer 121. The source electrode 127a and the drain electrode 127b are spaced apart from each other, are in contact with the source region 109b and the drain region 109c exposed through the active layer contact holes, respectively, and are made of the same second metal material as that of the data line (not shown). In this embodiment, the active layer 109, the gate insulating layer 113, the gate electrode 115a, and the interlayer insulating layer 121, which are sequentially stacked, and the source electrode 127a and the drain electrode 127b formed to be spaced apart from each other form a TFT (T).

In the drawings, the data line (not shown), the source electrode 127a, and the drain electrode 127b are all illustrated to have a unilayer structure, but these may also have a dual-layer or triple-layer structure.

Although not shown, a TFT is formed in the switching region (not shown). The switching TFT (not shown) is electrically connected to the driving TFT, the gate line (not shown), and the data line (not shown). Namely, the gate line (not shown) and the data line (not shown) are connected to a gate electrode (not shown) and a source electrode (not shown) of the switching TFT (not shown) and a drain electrode (not shown) of the switching TFT (not shown) is electrically connected to the gate electrode of the driving TFT (T).

Meanwhile, in the organic electroluminescent device according to an embodiment of the present invention, for example, the driving TFT (T) and the switching TFT (not shown) have the active layer 109 of polysilicon and are configured as a top gate type, but the driving TFT (T) and the switching TFT (not shown) may also be configured as a bottom gate type having an active layer of amorphous silicon.

When the driving TFT (T) and the switching TFT (not shown) are configured as a bottom gate type, a stacking structure thereof includes a gate electrode, a gate insulating layer, an active layer formed of an ohmic-contact layer of impurity amorphous silicon and spaced apart from an active layer of pure amorphous silicon, and a source electrode and a drain electrode spaced apart from each other. In this case, the gate line is formed to be connected to the gate electrode of the switching TFT in a layer on which the gate electrode is formed, and the data line is formed to be connected to the source electrode in a layer on which the source electrode of the switching TFT is formed.

Meanwhile, a passivation layer 131 and a planarization layer 133, exposing the drain electrode 127b of the driving TFT (T), are stacked on the driving TFT (T) and the switching TFT (not shown). In this case, an insulating material, e.g., silicon oxide ($SiO_2$) or a silicon nitride (SiNx) as an inorganic insulating material, is used as a material of the interlayer insulating layer 121. Also, an organic material including photo acryl may be used to form the planarization layer 133.

Meanwhile, at least one second line hole pattern 135b is formed in a portion of the passivation layer 131 positioned in the pad region PD. In this case, the second line hole pattern 135b is formed in a longer-side direction of the pad region PD, namely, opposing the display region AA. The at least one second line hole pattern 135b may be formed such that it overlaps with the underlying first line hole pattern 125c or may not overlap therewith.

Also, a first electrode 137 is formed on the planarization layer 133. The first electrode 137 is in contact with the drain electrode 127b of the driving TFT (T) through the drain contact hole (not shown), and separated by each pixel region. The first electrode 137 may be provided as a transparent electrode or a reflective electrode. When the first electrode 137 is used as a transparent electrode, it may be made of ITO, IZO, ZnO, or $In_2O_3$, and when the first electrode 137 is used as a reflective electrode, a reflective layer may be formed with Ag, Mg, Al, Pt, Pd, Au, Ni, Nd, Ir, Cr, a compound thereof, and the like, and ITO, IZO, ZnO, or $In_2O_3$ may be formed thereon.

A pixel defining layer 139 made of an insulating material, in particular, for example, BCB, polyimide, or photo acryl is formed in a boundary area of each pixel region above the first electrode 137. In this case, the pixel defining layer 139 surrounds each pixel region (not shown) and overlaps with edges of the first electrode 137 and has a grid form having a plurality of openings overall in the display region AA.

An organic light emitting layer 141 made of organic materials emitting red, green, and blue light is formed on the first electrode 137 in each pixel region surrounded by the pixel defining layer 319. The organic light emitting layer 141 may be configured as a uni-layer made of organic light emitting materials. Also, although not shown, the organic light emitting layer 141 may be configured as multiple layers including a hole injection layer, a hole transporting layer, an emitting material layer, an electron transporting layer, and an electron injection layer, in order to enhance luminance efficiency.

Also, a second electrode 143 is formed on substantially an entire surface of the display region AA including on the organic light emitting layer 141 and the pixel defining layer 139. In this embodiment, the first electrode 137, the second electrode 143, and the organic light emitting layer 141 interposed between the two electrodes 137 and 143 constitute an organic electroluminescence element E.

Thus, when a predetermined voltage is applied to the first electrode 137 and the second electrode 143 of the organic electroluminescence element E according to a selected color signal, holes injected from the first electrode 137 and electrons provided from the second electrode 143 are transported to the organic light emitting layer 141 to form exciton, and when the exciton transitions from an excited state to a ground state, light is generated and emitted in the form of visible light. In this case, the emitted light is released to the outside through the transparent second electrode 143, whereby the flexible organic electroluminescent device implements a certain image.

Meanwhile, a lower passivation layer 145 made of an insulating layer, in particular, silicon oxide ($SiO_2$) or a silicon nitride (SiNx) as an inorganic insulating material, is formed on the entire surface of the substrate including the second electrode 143. In this case, moisture infiltration into the organic light emitting layer 141 cannot be completely prevented only by the second electrode 143, so the lower passivation layer 145 is formed on the second electrode 143, thus completely preventing moisture infiltration into the organic light emitting layer 141.

Also, an organic layer 147 made of a polymer organic material such as polymer is formed on the lower passivation layer 145 in the display region AA. In this case, as the polymer used to form the organic layer 147, an olefin-based polymer (polyethylene or polypropylene), polyethylene-terephthalate (PET), an epoxy resin, a fluoro resin, polysiloxane, or the like, may be used.

In order to prevent moisture infiltration through the organic layer 147, an upper passivation layer 149 made of an insulating layer, e.g., silicon oxide ($SiO_2$) or a silicon nitride (SiNx) as an inorganic insulating material, is additionally formed on the entire surface of the substrate including the organic layer 147.

A barrier film 151 is positioned on the entire surface of the substrate including the upper passivation layer 149 in order to encapsulate the organic electroluminescence element E. Between the substrate 101 and the barrier film 151, an adhesive (not shown) made of any one among frit which is transparent and has bonding characteristics, an organic insulating material, and a polymer material is interposed to allow the substrate 101 and the barrier film 151 to be completely and tightly attached without an air layer. A polarization plate 153 is disposed on the barrier film 151.

As the substrate 101 and the barrier film 151 are fixed by the adhesive (not shown) to form a panel state, the organic electroluminescent device according to an embodiment of the present invention is completed.

Also, in order to make the organic electroluminescent device configured as described into a flexible organic electroluminescent device, first a rear surface of the substrate 101 of the organic electroluminescent device is cleaned, and a laser is irradiated to separate the sacrificial layer 103 interposed between the substrate 101 and the polyimide layer 105. Thus, the substrate 101 is delaminated from the organic electroluminescent device.

Thereafter, a back plate is laminated on a surface of the polyimide layer 105 of the separated organic electroluminescent device to form a flexible organic electroluminescent device.

In this manner, according to the flexible organic electroluminescent device according to an embodiment of the present invention, since the line hole patterns are formed in surfaces of a plurality of inorganic layers, i.e., the gate insulating layer, the interlayer insulting layer, and the passivation layer, positioned in a pad region (PD), to which an FPCB is connected, which is weak due to repeated bending and spreading when the organic electroluminescent device is fabricated, in order to redirect a path of cracks so as to be prevented from spreading to the interior of the device, damage to the flexible organic electroluminescent device can be minimized.

In particular, since a plurality of line hole patterns, for example, 125c and 135b, are formed in a weak point adjacent to a scribe line SL, when cracks are generated, line damage and a path of cracks in the weak point are bypassed, thus preventing panel line cracks, a critical point.

Hereinafter, a method for fabricating a flexible organic electroluminescent device according to an embodiment of the present invention will be described with reference to FIGS. 7A to 7S.

Figure 7A:
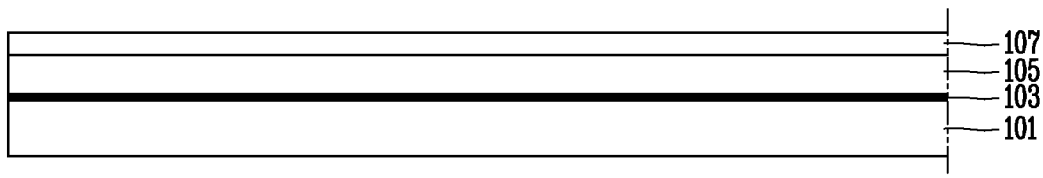
FIGS. 7A to 7S are cross-sectional views illustrating a process of fabricating the flexible organic electroluminescent device according to an embodiment of the present invention.
Figure 7B:
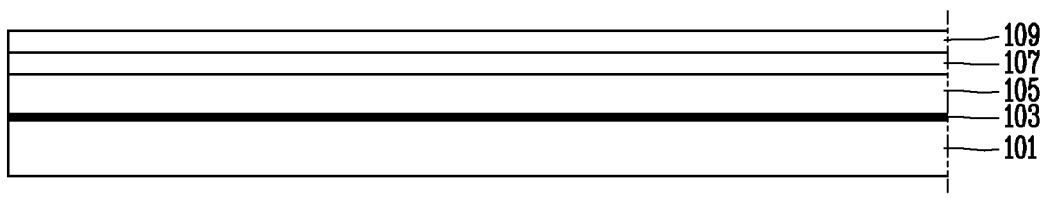
Figure 7C:
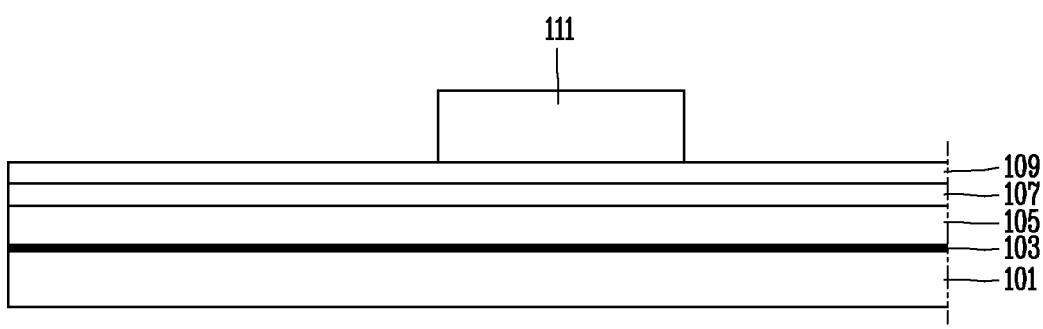
Figure 7D:
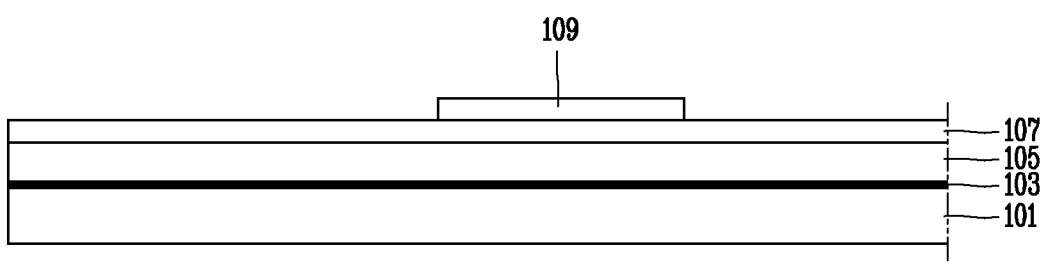
Figure 7E:
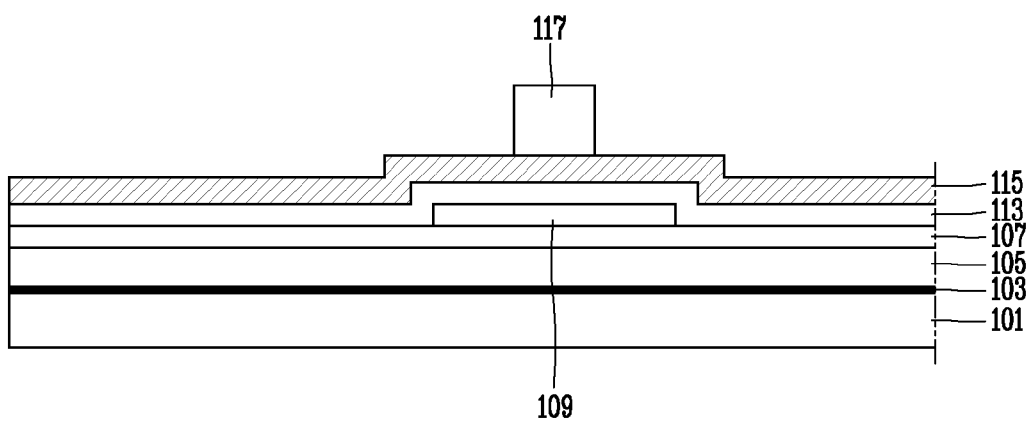
Figure 7F:
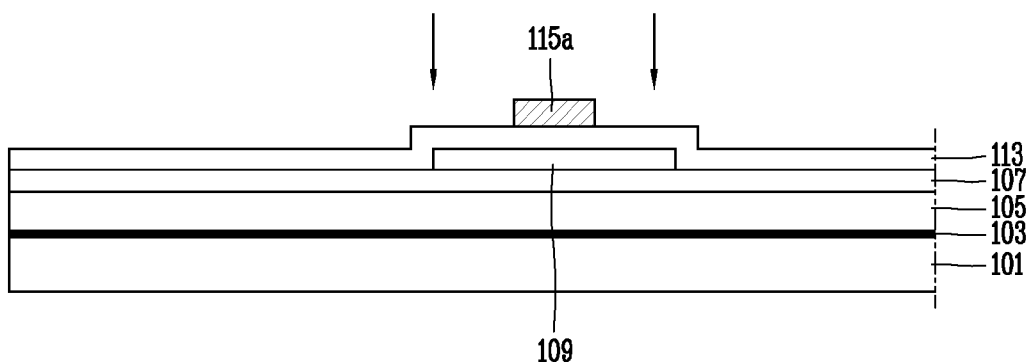
Figure 7G:
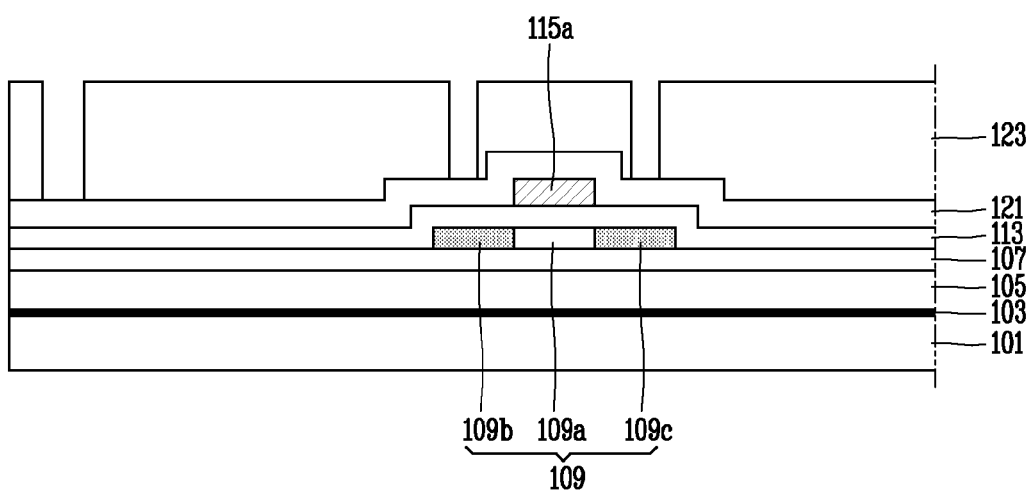
Figure 7H:
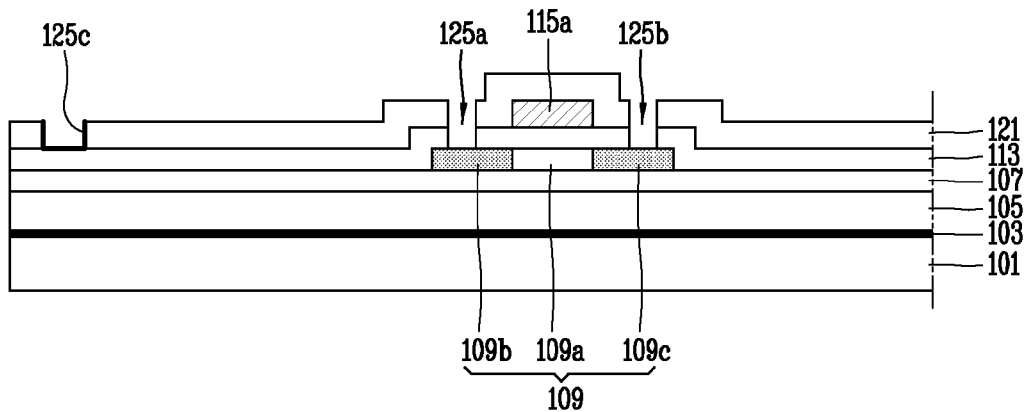
Figure 7I:
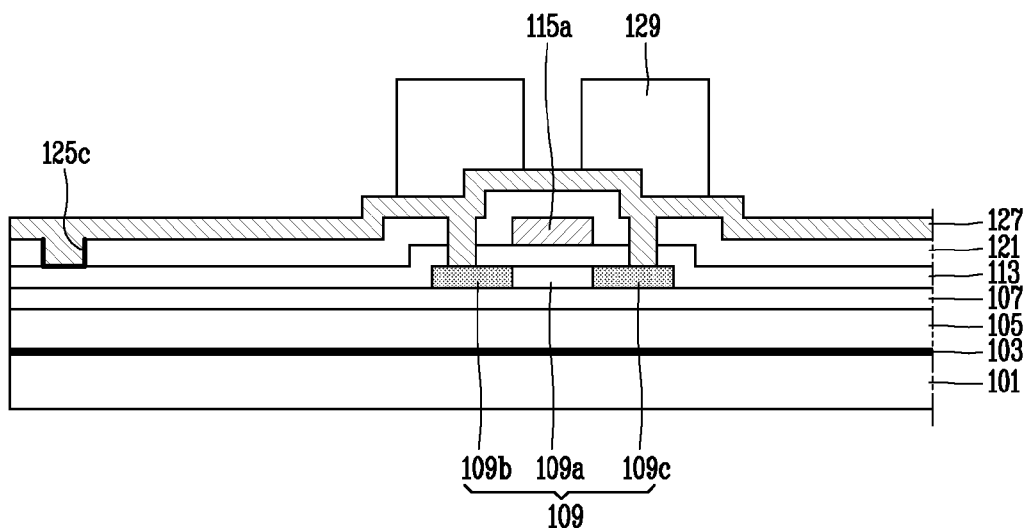
Figure 7J:
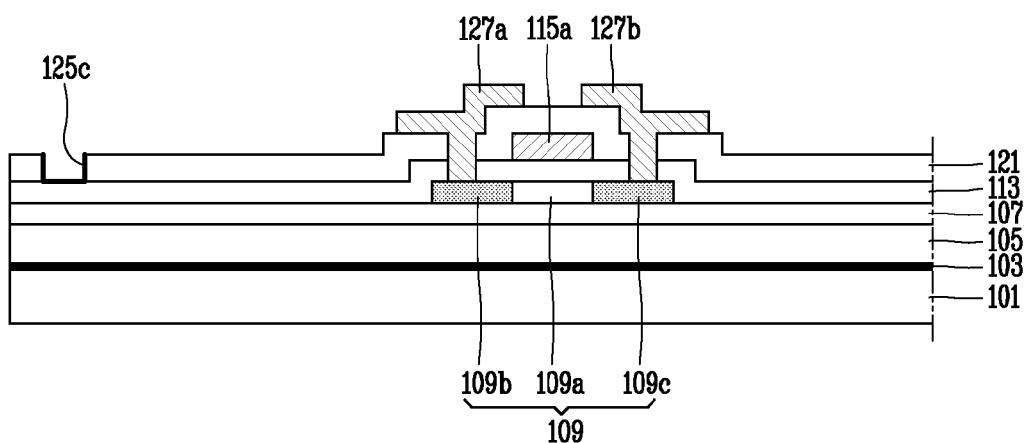
Figure 7K:
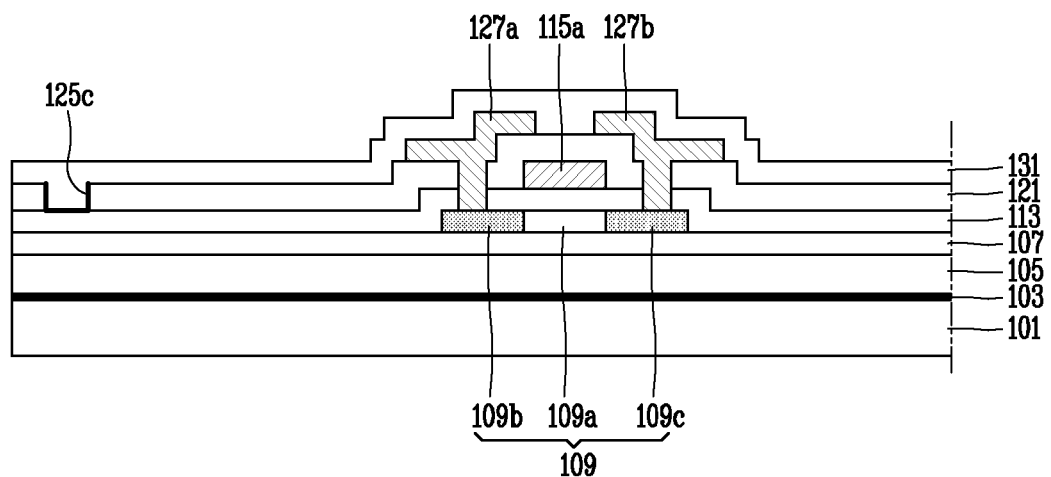
Figure 7L:
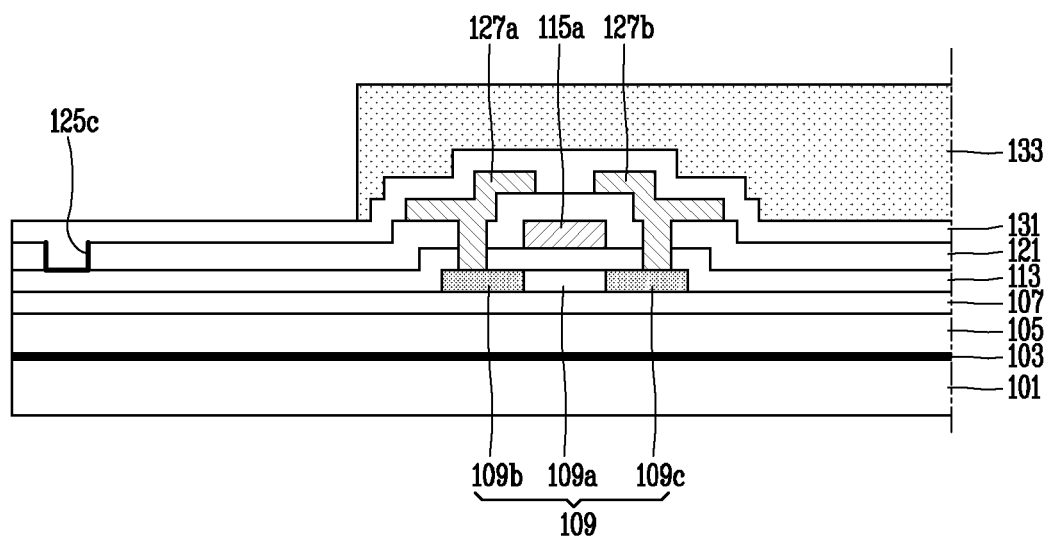
Figure 7M:
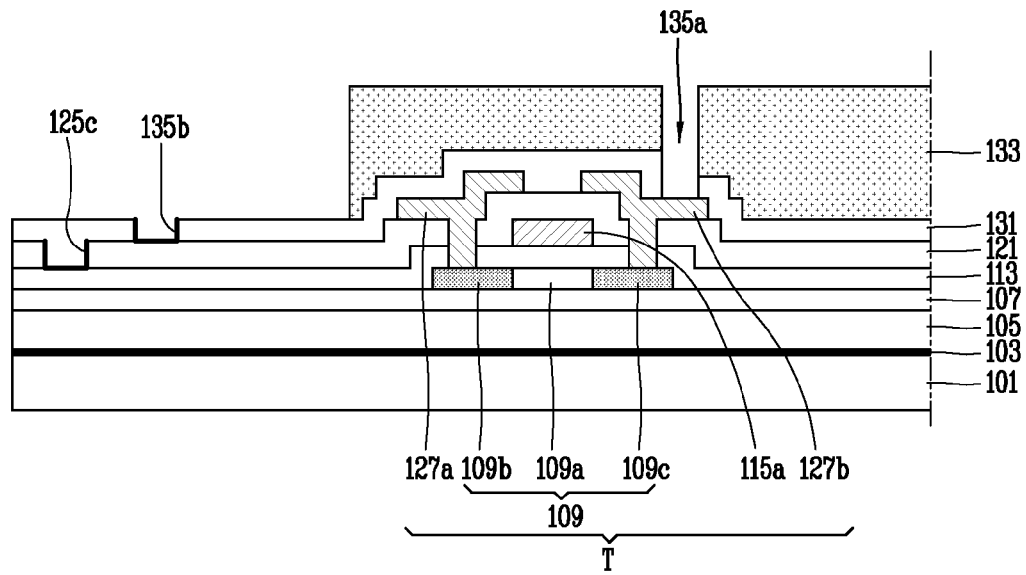
Figure 7N:
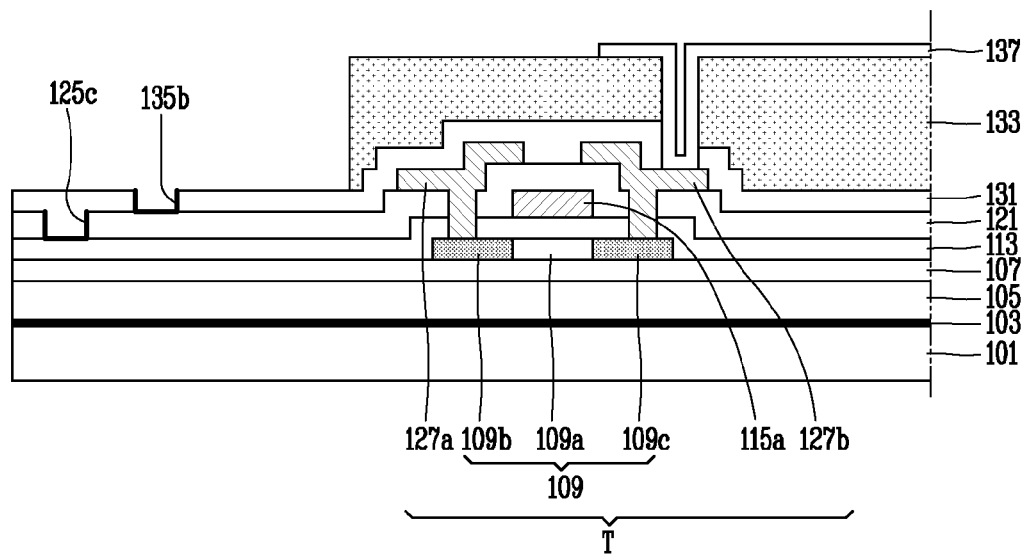
Figure 7O:
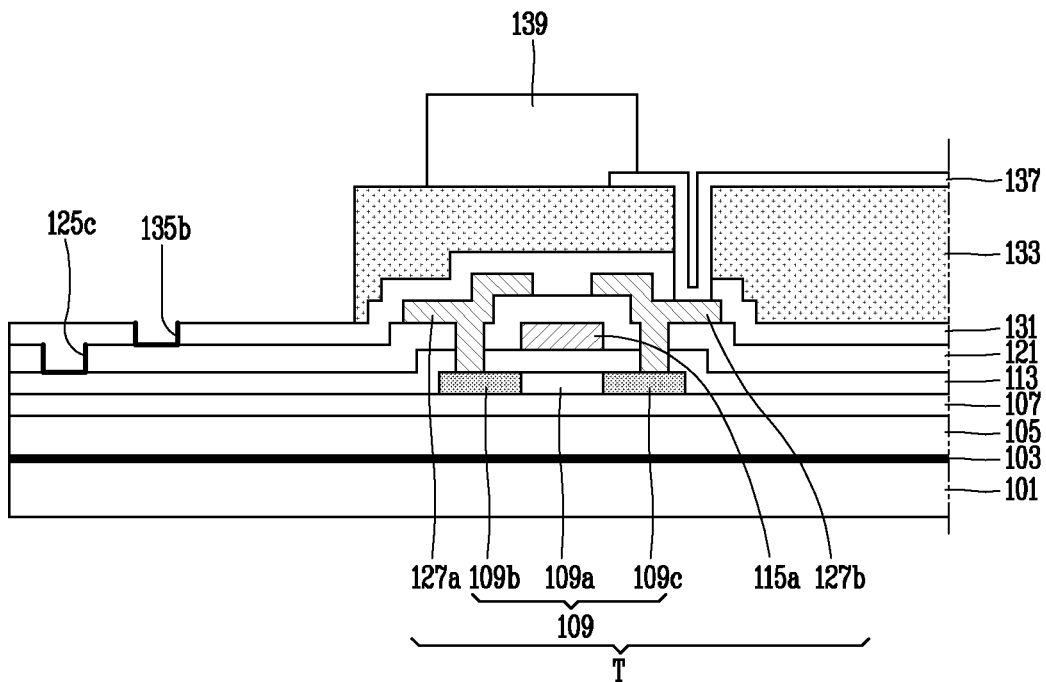
Figure 7P:
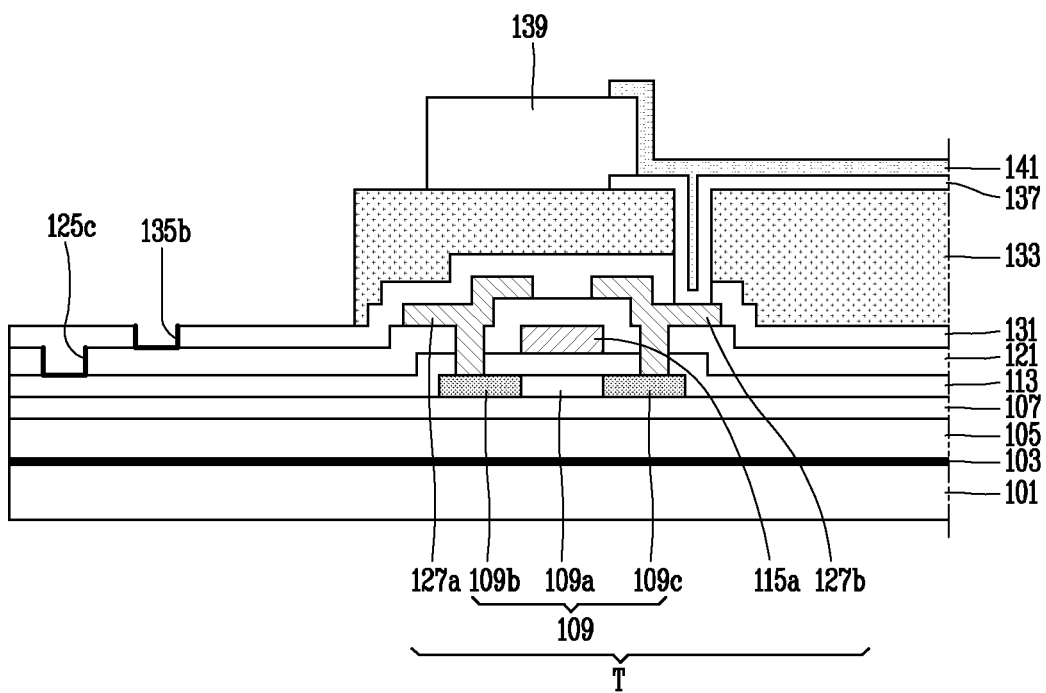
Figure 7Q:
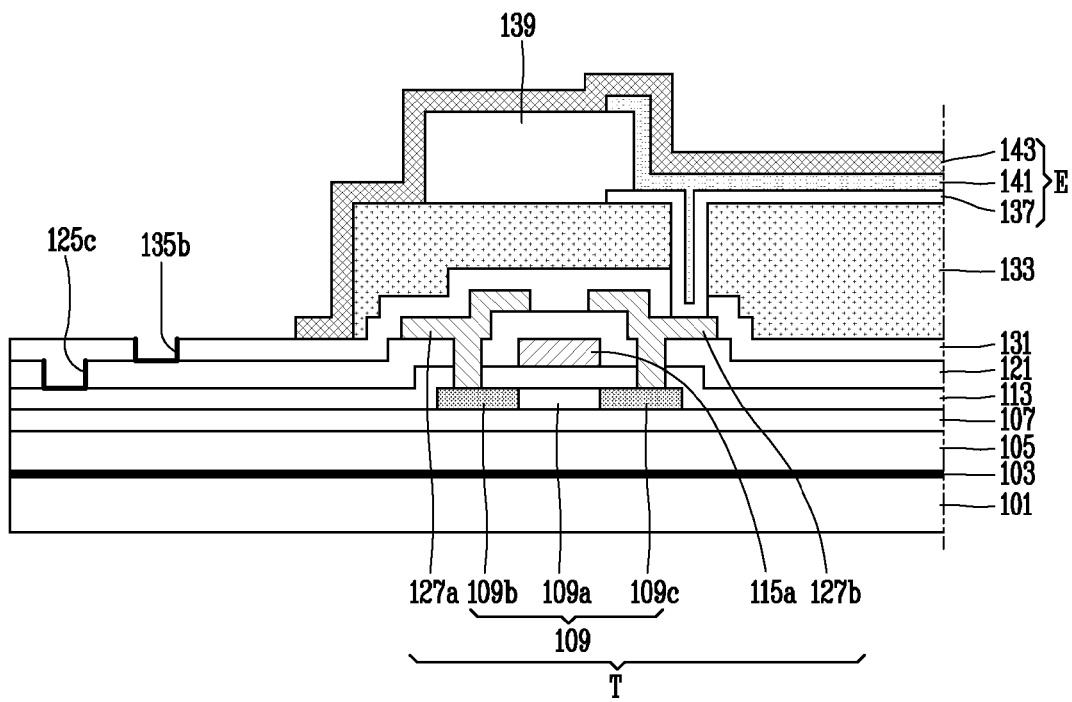
Figure 7R:
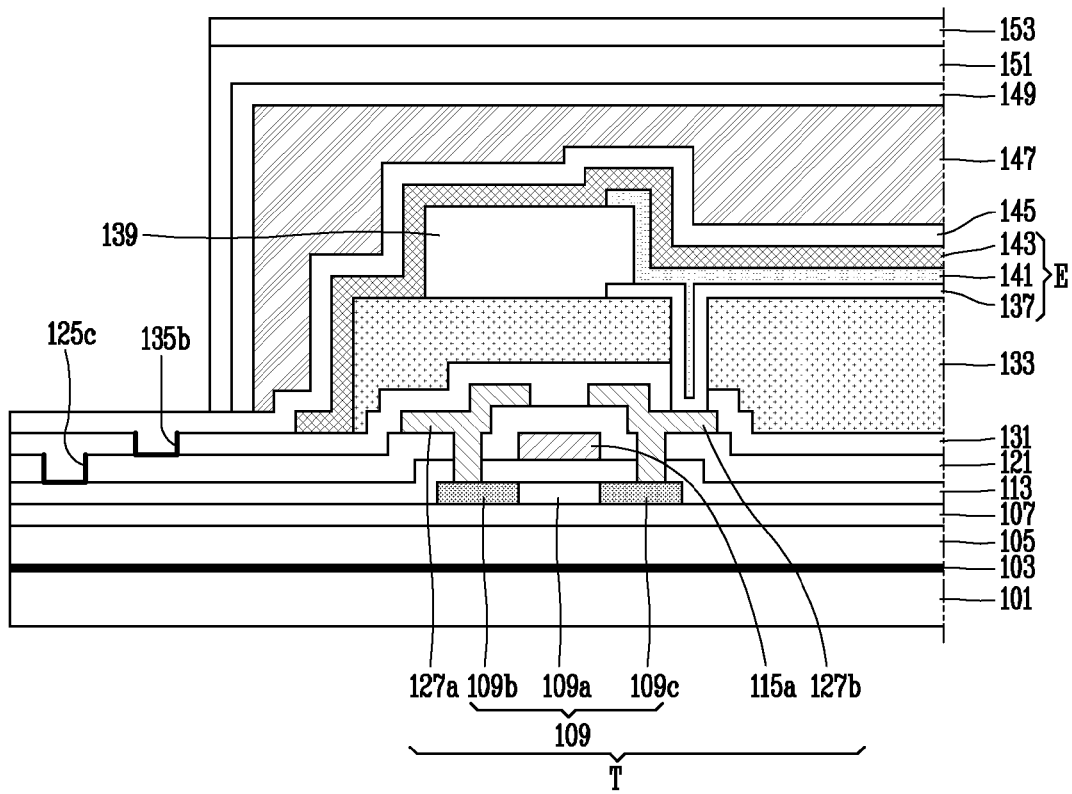
Figure 7S:
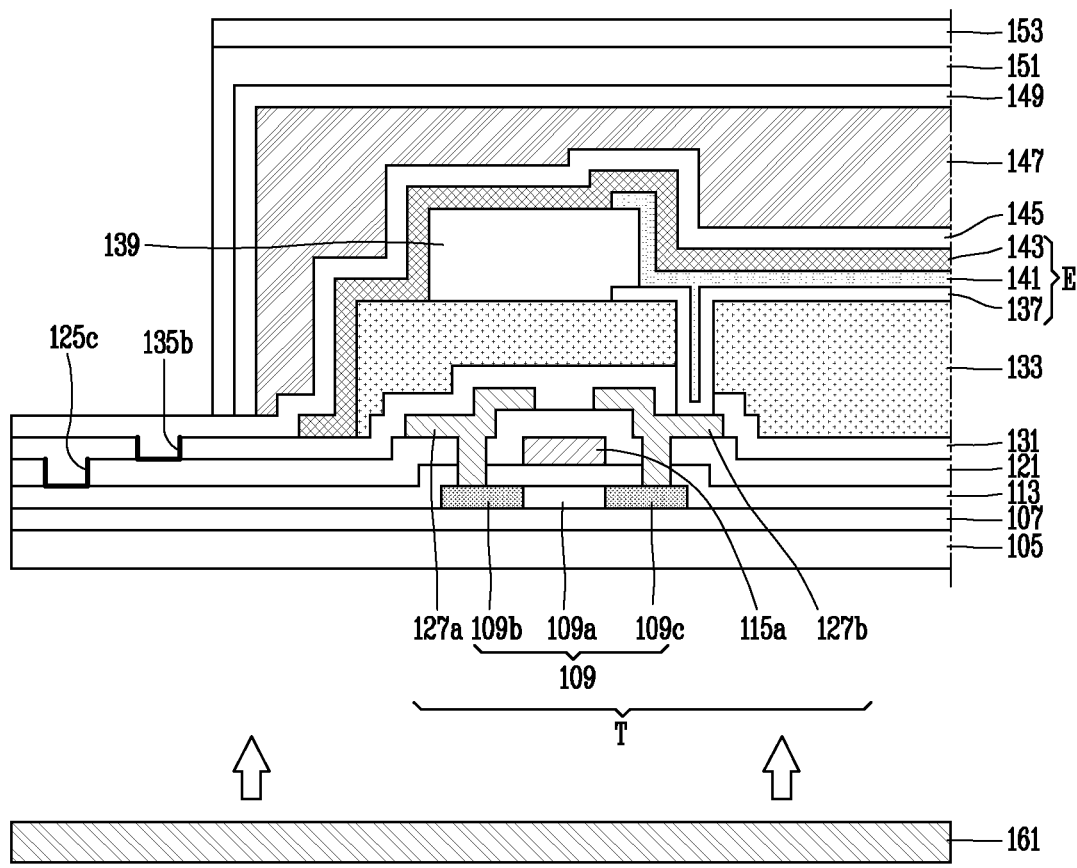

FIGS. 7A to 7S are cross-sectional views illustrating a process of fabricating the flexible organic electroluminescent device according to an embodiment of the present invention.

Here, the term film transistor (T) is assumed to be the same as a driving thin film transistor (T) as shown in FIG. 5. Further, the thin film transistor (T) can be used as a switching thin film transistor.

As illustrated in FIG. 7A, a substrate 101, for example a glass substrate, in which the display region AA and a non-display region (not shown) including the pad region PD outside of the display region AA are defined is prepared. The substrate 101 is delaminated or removed after the fabrication of the organic electroluminescent device, and a flexible back plate (161 in FIG. 7S) is then laminated on the organic electroluminescent device. The back plate 161 is formed of a flexible glass substrate or a material having flexibility so that although the flexible organic electroluminescent device is bent (or warped) like paper, it may have display performance as is.

Also, a polyimide layer 105 is formed on the substrate 101, and a buffer layer 107 having a multilayer structure made of an inorganic insulating material, e.g., silicon oxide (SiO$_2$) or a silicon nitride (SiNx) is formed on the polyimide layer 105. The reason for forming the buffer layer 107 below an active layer 109 formed in a follow-up process is to prevent a degradation of the characteristics of the active layer 109 due to emission of alkali ions from the interior of the substrate 101 when the active layer 109 is crystallized.

A sacrificial layer 103 made of amorphous silicon or silicon nitride (SiNx) is formed between the substrate 101 and the polyimide layer 105. The sacrificial layer 103 serves to allow the substrate 101 to be easily delaminated or separated from the polyimide layer 105 through a laser irradiation process after the fabrication of the organic electroluminescent device.

As illustrated in FIG. 7B, an active layer 109 is formed in each pixel region of the display region AA above the buffer layer 107. The active layer 109 includes a channel region 109a made of pure polysilicon and having a central portion forming a channel, and a source region 109b and a drain region 109c formed in both sides of the channel region 109a and having impurities doped with high concentration which are described and depicted with respect to FIGS. 7F and 7G.

The active layer 109 is formed on the buffer layer 107. In this case, the active layer 109 is made of pure polysilicon in each pixel region of the display region AA.

Subsequently, as illustrated in FIG. 7C, a first photosensitive film (not shown) is coated on the active layer 109 and selectively patterned through an exposing and developing process to form a first photosensitive film pattern 111.

Thereafter, as illustrated in FIG. 7D, the active layer 109 is selectively removed by using the first photosensitive film pattern 111 as an etching mask.

Subsequently, as illustrated in FIG. 7E, with the first photosensitive film pattern 111 removed, a gate insulating layer 113 and the first metal material layer 115 are sequentially deposited on the buffer layer 107 including on the active layer 109. In this case, the first metal material layer 115 may be made of a first metal material, e.g., any one of aluminum (Al), an Al alloy (AlNd), copper (Cu), a Cu alloy, molybdenum (Mo), and molytitanium (MoTi) to have a unilayer structure, or may be formed of two or more first metal materials to have a dual-layer or a triple-layer structure. In the drawings, the gate electrode and the gate line (not shown) are illustrated to have a unilayer structure.

Thereafter, a second photosensitive film (not shown) is coated on the first metal material layer 115 and selectively patterned through an exposing and developing process to form a second photosensitive film pattern 117.

Subsequently, as illustrated in FIG. 7F, the first metal material layer 115 is selectively etched by using the second photosensitive film pattern 117 as an etching mask to form the gate electrode 115a. A gate line (not shown) is formed to extend from the gate electrode 115a in one direction above the gate insulating layer 113.

Thereafter, the second photosensitive film pattern 117 is removed, and impurities are injected into both sides of the active layer 109 below the gate electrode 115a to form the channel region 109a forming a channel in a central portion of the active layer 109, and the source region 109b and the drain region 109c spaced apart from each other on the basis of the channel region 109a.

Subsequently, as illustrated in FIG. 7G, the interlayer insulating layer 121 made of an insulating material, e.g., a silicon oxide (SiO$_2$) or a silicon nitride (SiNx) as an inorganic insulating material, is formed on the entire surface of the display region above the gate electrode 115a and the gate line (not shown).

Thereafter, a third photosensitive film (not shown) is coated on the interlayer insulating layer 121 and selectively patterned through an exposing and developing process to form a third photosensitive film pattern 123.

Subsequently, as illustrated in FIG. 7H, the interlayer insulating layer 121 and the underlying gate insulating layer 113 are selectively etched by using the third photosensitive film pattern 123 as an etching mask to simultaneously form a source region contact hole 125a and a drain region contact hole 125b exposing the source region 109b and the drain region 109c of the active layer 109. In this case, in forming the source region contact hole 125a and the drain region contact hole 125b, at least one first line hole pattern 125c is also formed in a portion of the interlayer insulating layer 121 positioned in the pad region PD. The first line hole pattern 125c is formed in the longer-side direction of the pad region, namely, opposing the display region AA.

Thereafter, as illustrated in FIG. 7I, the third photosensitive film pattern 123 is removed, and a second metal material layer 127 is formed on the interlayer insulating layer 121 including the first line hole 125c. The second metal material layer 127 crosses the gate line (not shown) to define the pixel region (not shown). In this case, the second metal material layer 127 may be made of any one or two or more of aluminum (Al), an Al alloy (AlNd), copper (Cu), a Cu alloy, molybdenum (Mo), molytitanium (MoTi), chromium (Cr), and titanium (Ti).

Subsequently, a fourth photosensitive film (not shown) is coated on the second metal material layer 127 and patterned through an exposing and developing process to form a fourth photosensitive film pattern 129.

Thereafter, as illustrated in FIG. 7J, the second metal material layer 127 is selectively etched by using the fourth photosensitive film pattern 129 as an etching mask to form a data line (not shown) crossing the gate line (not shown) to define the pixel region P and a power line (not shown) spaced apart from the data line. In this case, the power line (not shown) may be formed on the layer in which the gate line (not shown) is formed, namely, on the gate insulating layer such that it is spaced apart from the gate line (not shown) abreast.

Also, in forming the data line (not shown), the source electrode 127a and the drain electrode 127b are formed on the interlayer insulating layer 121. The source electrode 127a and the drain electrode 127b are spaced apart from each other, are in contact with the source region 109b and the drain region 109c exposed through the active layer contact holes (not shown), respectively, and are made of the same second metal material as that of the data line (not shown). The active layer 109, the gate insulating layer 113, the gate electrode 115a, and the interlayer insulating layer 121, which are sequentially stacked, and the source electrode 127a and the drain electrode 127b formed to be spaced apart from each other form a TFT (T).

Meanwhile, in the drawings, the data line (not shown), the source electrode 127a, and the drain electrode 127b are all illustrated to have a unilayer structure, but these may also have a dual-layer or triple-layer structure.

Although not shown, a switching TFT (not shown) having the same stacking structure as that of the driving TFT (T) is formed. In this case, the switching TFT (not shown) is electrically connected to the driving TFT, the gate line (not shown), and the data line (not shown). Namely, the gate line (not shown) and the data line (not shown) are connected to a gate electrode (not shown) and a source electrode (not shown) of the switching TFT (not shown) and a drain electrode (not shown) of the switching TFT (not shown) is electrically connected to the gate electrode of the driving TFT (T).

Meanwhile, in the organic electroluminescent device according to an embodiment of the present invention, for example, the driving TFT (T) and the switching TFT (not shown) have the active layer 109 of polysilicon and are configured as a top gate type, but the driving TFT (T) and the switching TFT (not shown) may also be configured as a bottom gate type having an active layer of amorphous silicon.

When the driving TFT (T) and the switching TFT (not shown) are configured as a bottom gate type, a stacking structure thereof includes a gate electrode, a gate insulating layer, an active layer formed of an ohmic-contact layer of impurity amorphous silicon and spaced apart from an active layer of pure amorphous silicon, and a source electrode and a drain electrode spaced apart from each other. In this case, the gate line is formed to be connected to the gate electrode of the switching TFT in a layer on which the gate electrode is formed, and the data line is formed to be connected to the source electrode in a layer on which the source electrode of the switching TFT is formed.

Subsequently, as illustrated in FIG. 7K, with the fourth photosensitive film pattern 129 having been removed, a passivation layer 131 is formed on the entire surface of the substrate including the source electrode 127a and the drain electrode 127b. In this case, as a material of the passivation layer 131, an insulating material, e.g., a silicon oxide (SiO$_2$) or a silicon nitride (SiNx) as an inorganic insulating material, is used.

Thereafter, as illustrated in FIG. 7L, the planarization layer 133 made of an organic material is formed on the passivation layer 131. In this case, the organic material may be one selected from the group consisting of polyacryl, polyimide, polyamide (PA), benzocyclobutene (BCB), and a phenol resin, as hydrophobic organic materials having insulating properties.

Subsequently, as illustrated in FIG. 7M, the planarization layer 133 and the underlying passivation layer 131 are sequentially etched to form a drain contact hole 135a exposing the drain electrode 127b. In this case, in forming the drain contact hole 135a, at least one second line hole pattern 135b is also formed in a portion of the passivation layer 131 positioned in the pad region PD. Here, the second line hole pattern 135b may be formed in the longer-side direction of the pad region PD, namely, opposing the display region AA and may not overlap with the first line hole pattern 125c formed in the interlayer insulating layer 121 or may overlap therewith.

Thereafter, as illustrated in FIG. 7N, a conductive material layer (not shown) is deposited on the planarization layer 133 and selectively etched through a masking process to form a first electrode 137 which is in contact with the drain electrode 127b of the TFT (T) and is separated by each pixel region. In this case, the conductive material layer (not shown) may be provided as a transparent electrode or a reflective electrode. When the first electrode 137 is used as a transparent electrode, it may be made of ITO, IZO, ZnO, or In$_2$O$_3$, and when the first electrode 137 is used as a reflective electrode, a reflective layer may be formed with Ag, Mg, Al, Pt, Pd, Au, Ni, Nd, Ir, Cr, a compound thereof, and the like, and ITO, IZO, ZnO, or In$_2$O$_3$ may be formed thereon.

Subsequently, as illustrated in FIG. 7O, an insulating material layer (not shown) made of, for example, BCB, polyimide, or photo acryl is formed in a boundary area of each pixel region on the first electrode 137.

Thereafter, the insulating material layer (not shown) is selectively patterned to form the pixel defining layer 139. In this case, the pixel defining layer 139 is formed to overlap with edges of the first electrode 137 such that it surrounds each pixel region, and has a grid form having a plurality of openings overall in the display region AA.

Subsequently, as illustrated in FIG. 7P, the organic light emitting layer 141 emitting red, green, and blue light is formed on the first electrode layer within each pixel region surrounded by the pixel defining layer 139. In this case, the organic light emitting layer 141 may be configured as a uni-layer made of organic light emitting materials. Also, although not shown, the organic light emitting layer 141 may be configured as multiple layers including a hole injection layer, a hole transporting layer, an emitting material layer, an electron transporting layer, and an electron injection layer, in order to enhance luminance efficiency.

Thereafter, as illustrated in FIG. 7Q, the second electrode 143 is formed on the entire surface of the display region AA including the organic light emitting layer 141 and an upper portion and side portion of the pixel defining layer 139. In this case, the second electrode 143 may be provided as a transparent electrode or a reflective electrode. When the second electrode 143 is used as a transparent electrode, it is used as a cathode electrode, so a metal having a small work function, i.e., Li, Ca, LiF/Ca, LiF/Al, Al, Ag, Mg, and a compound thereof, is deposited toward the organic layer 129, on which an auxiliary electrode layer or a bus electrode line may be formed of a transparent electrode formation material such as ITO, IZO, ZnO, $In_2O_3$, or the like. When the second electrode 143 is used as a reflective electrode, Li, Ca, LiF/Ca, LiF/Al, Al, Ag, Mg, and a compound thereof is deposited entirely.

Thus, the organic electroluminescence element E, which emits red, green, and blue light according to a flow of a current to display predetermined image information, includes the first electrode 137 connected to the drain electrode 127b of the TFT (T) to supply positive power therefrom, the second electrode 143 provided to cover the entire pixels to supply negative power, and the organic light emitting layer 141 disposed between the first electrode 137 and the second electrode 143 to emit light.

The first electrode 137 and the second electrode 143 are insulated from each other by the organic light emitting layer 141, and when a voltage is applied, the organic light emitting layer 141 emits light.

Thus, when a predetermined voltage is applied to the first electrode 137 and the second electrode 143 of the organic electroluminescence element E according to a selected color signal, holes injected from the first electrode 137 and electrons provided from the second electrode 143 are transported to the organic light emitting layer 141 to form exciton, and when the exciton transitions from an excited state to a ground state, light is generated and emitted in the form of visible light. In this case, the emitted light is released to the outside through the transparent second electrode 143, whereby the flexible organic electroluminescent device implements a certain image.

Subsequently, as illustrated in FIG. 7R, a lower passivation layer 145 made of an insulating layer, in particular, silicon oxide ($SiO_2$) or a silicon nitride (SiNx) as an inorganic insulating material, is formed on the entire surface of the substrate including the second electrode 143. In this case, moisture infiltration into the organic light emitting layer 141 cannot be completely prevented with only the second electrode 143. So the lower passivation layer 145 is formed on the second electrode 143. Thus, completely preventing moisture infiltration into the organic light emitting layer 141.

Thereafter, an organic layer 147 made of a polymer organic material such as polymer is formed in the display region AA and the non-display region on the lower passivation layer 145 through a method such as screen printing.

In this case, as the polymer used to form the organic layer 147, an olefin-based polymer (polyethylene or polypropylene), polyethyleneterephthalate (PET), an epoxy resin, a fluoro resin, polysiloxane, or the like, may be used. The organic layer 147 is formed in the display region AA.

In order to prevent moisture infiltration through the organic layer 147, an upper passivation layer 149 made of an insulating layer, e.g., silicon oxide ($SiO_2$) or a silicon nitride (SiNx) as an inorganic insulating material, is additionally formed on the entire surface of the substrate including the organic layer 147.

Thereafter, the barrier film 151 is positioned on the entire surface of the substrate including the upper passivation layer 149 in order to encapsulate the organic electroluminescence element E. Between the substrate 101 and the barrier film 151, an adhesive (not shown) made of any one among frit which is transparent and has bonding characteristics, an organic insulating material, and a polymer material is interposed to allow the substrate 101 and the barrier film 151 to be completely and tightly attached without an air layer. Thereafter, a polarization plate 153 is attached to the barrier film 151.

As the substrate 101 and the barrier film 151 are fixed by the adhesive (not shown) to form a panel state, the process of fabricating the organic electroluminescent device according to an embodiment of the present invention is completed.

Thereafter, as illustrated in FIG. 7S, in order to make the organic electroluminescent device configured as described into a flexible organic electroluminescent device, first a rear surface of the substrate 101 of the organic electroluminescent device is cleaned, and a laser is irradiated to separate the sacrificial layer 103 interposed between the substrate 101 and the polyimide layer 105. Thus, delaminating the substrate 101 from the organic electroluminescent device.

Thereafter, a back plate 161 is laminated on a surface of the polyimide layer 105 of the separated organic electroluminescent device, thus completing the fabrication process of the flexible organic electroluminescent device.

Figure 8:
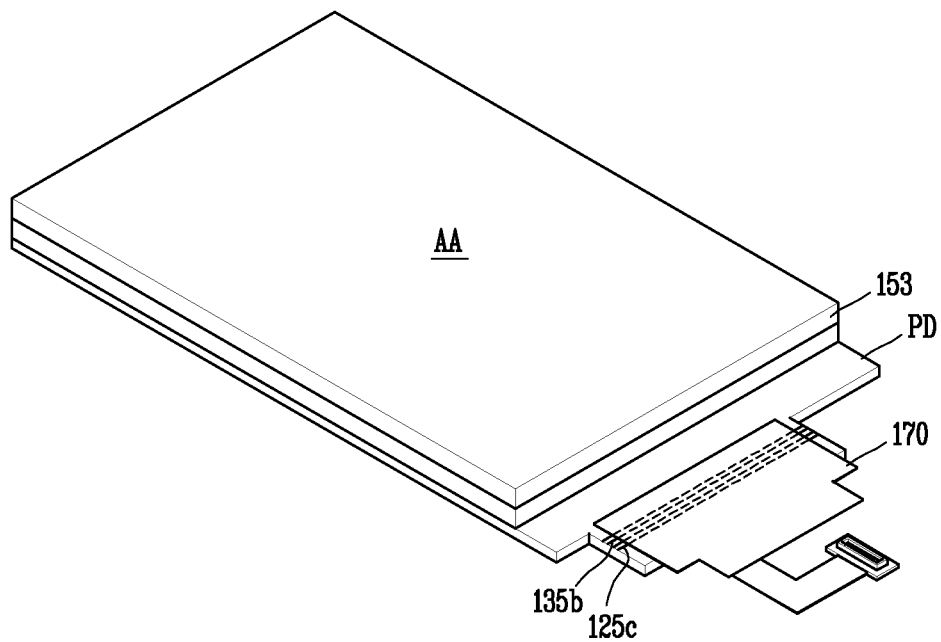
FIG. 8 is a schematic perspective view of the flexible organic electroluminescent device according to an embodiment of the present invention.

FIG. 8 is a schematic perspective view of the flexible organic electroluminescent device according to an embodiment of the present invention.

Figure 9:
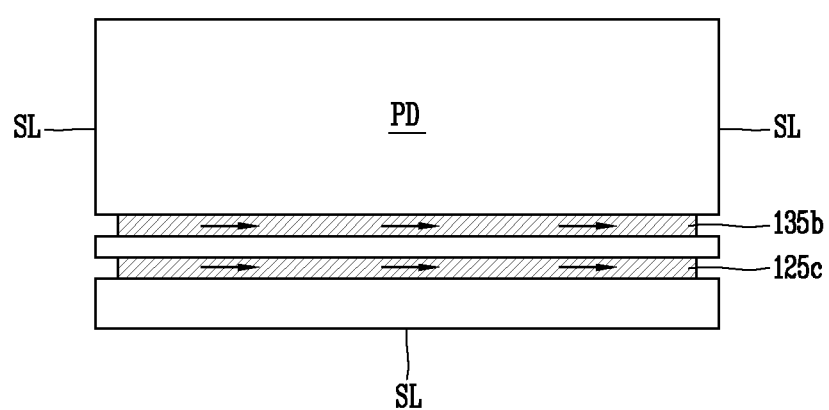
FIG. 9 is an enlarged plan view of a pad region of the flexible organic electroluminescent device according to an embodiment of the present invention, illustrating a state in which a path of cracks is bypassed along a plurality of line hole patterns.

FIG. 9 is an enlarged plan view of a pad region PD of the flexible organic electroluminescent device according to an embodiment of the present invention, illustrating a state in which a path of cracks is redirected along a plurality of line hole patterns.

Here, a thin film transistor (T) assumes the same as a driving thin film transistor (T) as shown in FIG. 5. Further, the thin film transistor (T) can be used as a switching thin film transistor.

As illustrated in FIG. 8, the line hole patterns 125c and 135b are formed in the surfaces of a plurality of inorganic layers, e.g., the interlayer insulating layer 121 and the passivation layer 131, positioned in the pad region PD, to which an FPCB 170 is connected, which is weak due to repeated bending and spreading when the organic electroluminescent device is fabricated.

As illustrated in FIG. 9, the line hole patterns 125c and 135b are formed to be adjacent to a panel scribe line in the surfaces of the interlayer insulating layer 121 and the passivation layer 131 positioned in the pad region PD, to which an FPCB 170 is connected, which is weak due to repeated bending and spreading when the organic electroluminescent device is fabricated, in order to bypass a transmission path of cracks generated due to absorption and damage to the weak point in the event of external impact, and thus, transmission of the cracks to the interior of the display region can be minimized.

Hereinafter, another example of the line hole pattern provided in the pad region of the flexible organic electroluminescent device according to an embodiment of the present invention will be described with reference to FIG. 10.

Figure 10:
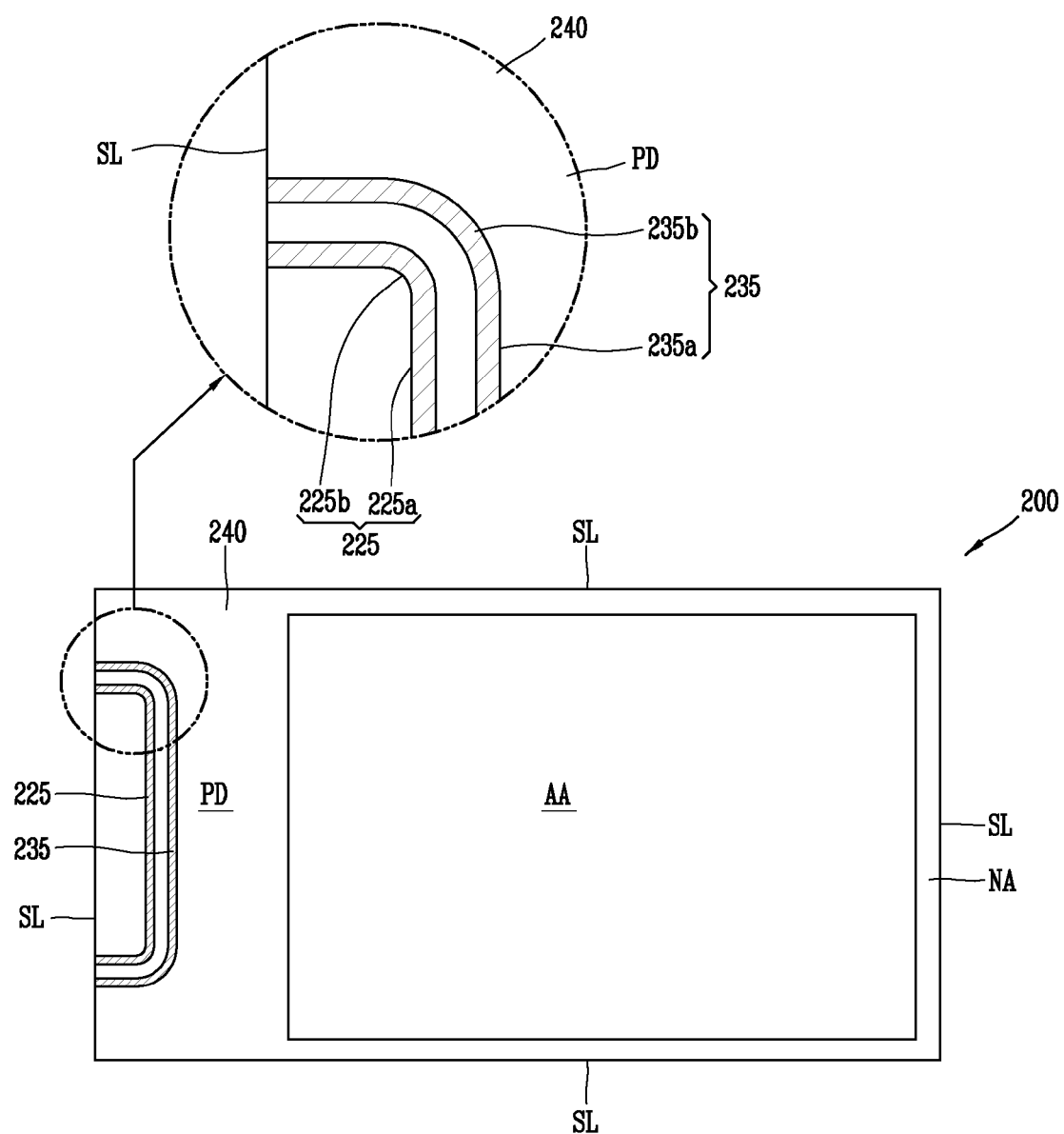
FIG. 10 is a perspective view illustrating another example of line hole patterns of the pad region of the flexible organic electroluminescent device according to an embodiment of the present invention.

FIG. 10 is a perspective view schematically illustrating another example of line hole patterns of the pad region of the flexible organic electroluminescent device according to an embodiment of the present invention.

In the flexible organic electroluminescent device according to an embodiment of the present invention, a separate member, e.g., a camera or any other members may be disposed as necessary according to an application field. In this case, such members may not be disposed in the display region AA, so the pad region PD is used instead.

In this case, since the camera or other components are to be disposed in a portion of the pad region PD, the area of the pad region PD may be reduced as much in designing the pad region.

In this case, since the area of the pad region PD of the flexible organic electroluminescent device according to an embodiment of the present invention is reduced, the shape of the line hole pattern formed in the pad region PD should be changed.

Here, a case in which first and second line hole patterns 225 and 235 according to another embodiment of the present invention are formed on the gate insulating layer 113, the interlayer insulating layer 121 and the passivation layer 131 of the first embodiment of the present invention illustrated in FIG. 5 will be described as an example.

Namely, a case in which the first line hole pattern 225 is formed in the interlayer insulating layer 121 and the second line hole pattern 235 is formed on the passivation layer (131 in FIG. 5) will be described as an example.

Referring to FIG. 10, in the flexible organic luminescent device 200 according to an embodiment of the present invention, a display region AA is defined on a substrate (not shown), and a non-display region NA including a pad region PD is defined outside the display region AA.

A space portion 240 is provided in both edge portions of the non-display region such that it is adjacent to the pad region PD, to allow a camera or any other members to be disposed therein. The pad region PD has an area smaller than that of the first embodiment, and thus, the first and second line hole patterns 225 and 235 formed in the interlayer insulating layer (not shown) and the passivation layer (not shown) positioned in the pad region PD have a shape different from the previously disclosed shape.

Here, the first and second line hole patterns 225 and 235 include linear portions 225a and 235a and bent portions 225b and 235b, respectively. The linear portions 225a and 235a correspond to central regions of the first and second line hole patterns 225 and 235, and the bent portions 225b and 235b correspond to both side end regions of the first and second line hole patterns 225 and 235.

Thus, since the bent portions 225b and 235b are formed in both side end regions of the first and second line hole patterns 225 and 235 in consideration of the reduction in the area of the pad region PD as necessary, a path of cracks due to impact, or the like, generated due to the repeated warping (or bending) or spreading in fabricating the flexible organic luminescent device can be bypassed so as not to be transmitted to the interior of the device, thus minimizing damage to the flexible organic luminescent device.

In this manner, according to the flexible organic luminescent device according to embodiments of the present invention, line hole patterns are formed in surfaces of a plurality of inorganic layers, i.e., the gate insulating layer, the interlayer insulating layer, and the passivation layer, positioned in a weak region, i.e., a pad region PD to which an FPCB is connected, because of repeated bending and spreading when the organic electroluminescent device is fabricated. Thus, a path of cracks is redirected and prevented from being spread to the interior of the device, which minimizes damage to the flexible organic electroluminescent device.

In particular, because a plurality of line hole patterns is formed in a weak point adjacent to a scribe line to redirect a path of line damage and cracks in the weak point, panel line cracks as a critical point can be prevented.

Another example of the line hole pattern provided in the pad region of the flexible organic electroluminescent device according to an embodiment of the present invention will be described with reference to FIG. 11.

Figure 11:
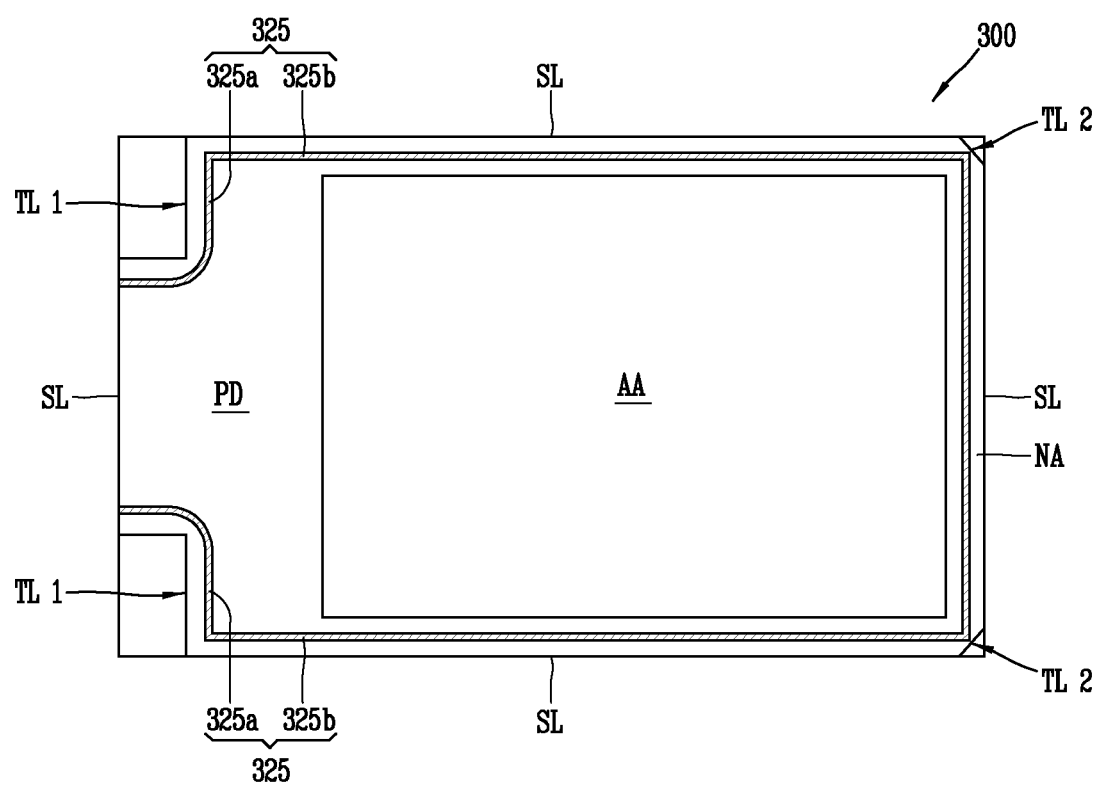
FIG. 11 is a perspective view illustrating another example of line hole patterns of the pad region of the flexible organic electroluminescent device according to an embodiment of the present invention.

FIG. 11 provides a perspective view schematically illustrating another example of line hole patterns of the pad region of the flexible organic electro luminescent device according to an embodiment of the present invention.

In the flexible organic electroluminescent device 300, a display region AA is defined on a substrate made of, for example, glass, a non-display region NA having a pad region PD is defined in an outer side of the display region AA, a plurality of pixel region (not shown) defined as regions formed by crossings of the gate lines (not shown) and data lines (not shown) are provided in the display region AA, and power lines (not shown) are provided in parallel to the data lines (not shown).

A scribe line SL is defined outside of the non-display region NA, and a first trimming line TL1 is defined at an edge of upper and lower of the pad region PD, and a second trimming line TL2 is defined at edges of upper and lower of the non-display region located opposite to the pad region.

In fabrication of the flexible organic electroluminescent device, a trimming cutting is applied on the first and second trimming lines TL1 and TL2.

As shown in FIG. 11, a first hole pattern 325a surrounding the first trimming line is formed at edges of upper and lower of the pad region PD. The first hole pattern 325a may be formed to have a curve type or linear type. Accordingly, due to the first hole pattern 325a, a path of cracks is redirected and prevented from spreading to the interior of the device; thereby minimizing damage to the flexible organic electroluminescent device.

Further, as illustrated in FIG. 11, a second hole pattern 325b extended from the first hole pattern 325a is formed at the non-display region NA located at outside of the display region AA opposite to the pad region PD. A crack preventing hole pattern 325 comprised the first hole pattern 325a and the second hole pattern 325b.

Accordingly, because all of the crack preventing hole 325 is formed by the first hole pattern 325a and the second hole pattern 325b, a path of cracks is redirected and prevented from spreading to the interior of the device. For example, a crack spreading from the second trimming line to the interior of the display region AA, and a crack spreading from the first trimming line of the pad region to the interior of the display region AA.

As disclosed above, according to the flexible organic electroluminescent device and the method for fabricating the same according to the present embodiments, line hole patterns are formed in surfaces of a plurality of inorganic layers, i.e., the gate insulating lyer, the interlayer insulating layer, and the passivation layer, positioned in a weak region, i.e., a pad region to which an FPCB is connected, or a non-display region including the pad region due to repeated bending and spreading when the organic electroluminescent device is fabricated. Thus, a path of cracks is redirected and prevented from spreading to the interior of the device which minimizes damage to the flexible organic electroluminescent device.

In particular, because a plurality of line hole patterns are formed in a weak point that is adjacent to a scribe line to redirect a path of line damage and cracks in the weak point, panel line cracks, as a critical point, can be prevented.

Further, because a curve hole pattern is formed at the periphery part of the trimming line to surrounding the trimming line of the pad region, a path of cracks is redirected and prevented from spreading to the interior of the device, which minimizes damage to the flexible organic electroluminescent device.

Meanwhile, because a line hole pattern extended from the curve hole pattern is further formed at the non-display region including the pad region surrounding the trimming line and the display region, a path of cracks is redirected and prevented from spreading to the interior of the device, which minimizes damage to the flexible organic electroluminescent device.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. An organic electroluminescent device having flexible characteristics, comprising:
    a substrate having a display region including a plurality of pixel regions and a non-display region including a pad region outside the display region, the pad region defined by an area to which a flexible printed circuit board (FPCB) is connected and having a shorter side and a longer side;
    a plurality of thin film transistors (TFTs) on a buffer layer on the substrate in the respective pixel regions on the substrate;
    an interlayer insulating layer in the display region including the TFTs on a gate insulating layer and the buffer layer, and the non-display region;
    a passivation layer on the interlayer insulating layer, wherein at least one line hole pattern is formed in one or more of the interlayer insulating layer and the passivation layer in the pad region of the non-display region in a direction substantially parallel with the longer side of the pad region;
    a planarization layer on the passivation layer;
    a first electrode in each pixel region on the planarization layer and connected to a drain electrode of a respective one of the plurality of TFTs via a contact hole through the planarization layer and the passivation layer;
    a pixel defining layer around each pixel region of the substrate including the first electrode and the non-display region;
    an organic light emitting layer being separately in each pixel region on the first electrode;
    a second electrode on the organic light emitting layer.

2. The organic electroluminescent device of claim 1, further comprising:
    a lower passivation layer on an entire surface of the substrate including the second electrode;
    an organic layer on the lower passivation layer in the display region;
    an upper passivation layer on the lower passivation layer including the organic layer;
    a barrier film disposed to face the substrate; and
    a polarization plate attached to the barrier film.

3. The organic electroluminescent device of claim 1, wherein the substrate is a glass substrate is made of a flexible material.

4. The organic electroluminescent device of claim 1, wherein the at least one line hole pattern overlaps when more than one.

5. The organic electroluminescent device of claim 1, wherein the at least one line hole pattern does not overlap when more than one.

6. The organic electroluminescent device of claim 1, wherein the at least one line hole pattern is formed at a pad region of the non-display region or at the non-display region including the pad region.

7. The organic electroluminescent device of claim 1, wherein at least one line hole pattern is also in the pad region of the gate insulating layer.

8. The organic electroluminescent device of claim 1, wherein a polyimide layer and a plurality of buffer layers are interposed between the substrate and the plurality of thin film transistors.

9. An organic electroluminescent device having flexible characteristics, comprising:
    a substrate having a display region including a plurality of pixel regions and a non-display region including a pad region outside the display region, the pad region defined by a shorter side and a longer side;
    a plurality of thin film transistors (TFTs) on a buffer layer on the substrate in the respective pixel regions on the substrate;
    an interlayer insulating layer in the display region including the TFTs on a gate insulating layer and the buffer layer, and the non-display region;
    a passivation layer on the interlayer insulating layer, wherein at least one line hole pattern is formed in one or more of the interlayer insulating layer and the passivation layer in the pad region of the non-display region in a direction substantially parallel with the longer side of the pad region;
    a planarization layer on the passivation layer;
    a first electrode in each pixel region on the planarization layer and connected to a drain electrode of a respective one of the plurality of TFTs via a contact hole through the planarization layer and the passivation layer;
    a pixel defining layer around each pixel region of the substrate including the first electrode and the non-display region;

an organic light emitting layer being separately in each pixel region on the first electrode;

a second electrode on the organic light emitting layer, wherein the at least one line hole pattern is formed at a pad region of the non-display region or at the non-display region including the pad region, and wherein the at least one line hole pattern includes a first hole pattern having curve portions surrounding a trimming line formed at edges of an upper and a lower of the pad region, and a second hole pattern extended from the first hole pattern having linear portions surrounding the display region at the non-display region located at an outside of the display region opposite to the pad region.

10. An organic electroluminescent device having flexible characteristics, comprising:

a substrate having a display region including a plurality of pixel regions and a non-display region including a pad region outside the display region;

a plurality of thin film transistors (TFTs) on a buffer layer on the substrate in the respective pixel regions on the substrate;

an interlayer insulating layer in the display region including the TFTs on a gate insulating layer and the buffer layer, and the non-display region, and having at least one line hole pattern formed only in the pad region of the non-display region;

a passivation layer directly on the interlayer insulating layer in the display region, wherein the at least one line hole pattern is formed in at least one of the interlayer insulating layer and the passivation layer and located at the non-display region, and has a depth of the respective interlayer insulating layer and the passivation layer;

a planarization layer on the passivation layer;

a first electrode in each pixel region on the planarization layer and connected to a drain electrode of a respective one of the plurality of TFTs via a contact hole through the planarization layer and the passivation layer;

a pixel defining layer around each pixel region of the substrate including the first electrode and the non-display region;

an organic light emitting layer being separately only in each pixel region on the first electrode;

a second electrode on substantially the entire surface of the display region directly contacting the organic light emitting layer, the pixel defining layer, and the planarization layer; and a lower passivation layer on the entire surface of the substrate including directly contacting the second electrode in the display region and the passivation layer in the pad region, wherein the at least one line hole pattern includes a first hole pattern having curve portions surrounding a trimming line formed at edges of an upper and a lower of the pad region, and a second hole pattern extended from the first hole pattern having linear portions surrounding the display region at the non-display region located at an outside of the display region opposite to the pad region.

11. The organic electroluminescent device of claim 10, further comprising:

an organic layer on the lower passivation layer including the organic layer;

a barrier film disposed to face the substrate; and a polarization plate attached to the barrier film.

12. The organic electroluminescent device of claim 10, wherein the line hole patterns are formed at a pad region of the non-display region or at the non-display region including the pad region.

* * * * *